(12) United States Patent  (10) Patent No.: US 8,420,435 B2
Rana et al.  (45) Date of Patent: Apr. 16, 2013

(54) ION IMPLANTATION FABRICATION PROCESS FOR THIN-FILM CRYSTALLINE SILICON SOLAR CELLS

(75) Inventors: Virendra V. Rana, Los Gatos, CA (US); Pawan Kapur, Palo Alto, CA (US); Mehrdad M. Moslehi, Los Altos, CA (US)

(73) Assignee: Solexel, Inc., Milpitas, CA (US)

( * ) Notice: Subject to any disclaimer, the term of this patent is extended or adjusted under 35 U.S.C. 154(b) by 236 days.

(21) Appl. No.: 12/774,713

(22) Filed: May 5, 2010

(65) Prior Publication Data

US 2010/0304522 A1   Dec. 2, 2010

Related U.S. Application Data

(60) Provisional application No. 61/175,698, filed on May 5, 2009.

(51) Int. Cl.
*H01L 31/18* (2006.01)

(52) U.S. Cl.
USPC ............ 438/71; 438/57; 438/98; 257/E31.13

(58) Field of Classification Search .................... 438/57, 438/71, 98
See application file for complete search history.

(56) References Cited

U.S. PATENT DOCUMENTS

| | | |
|---|---|---|
| 4,043,894 A | 8/1977 | Gibbs |
| 4,070,206 A | 1/1978 | Kressel et al. |
| 4,082,570 A | 4/1978 | House et al. |
| 4,165,252 A | 8/1979 | Gibbs |
| 4,249,959 A | 2/1981 | Jebens |
| 4,251,679 A | 2/1981 | Zwan |
| 4,348,254 A | 9/1982 | Lindmayer |
| 4,361,950 A | 12/1982 | Amick |
| 4,409,423 A | 10/1983 | Holt |
| 4,427,839 A | 1/1984 | Hall |
| 4,461,922 A | 7/1984 | Gay et al. |
| 4,479,847 A | 10/1984 | McCaldin et al. |
| 4,626,613 A | 12/1986 | Wenham et al. |
| 4,672,023 A | 6/1987 | Leung |
| 4,922,277 A | 5/1990 | Carlson |

(Continued)

FOREIGN PATENT DOCUMENTS

| | | |
|---|---|---|
| JP | 06-260670 A | 9/1994 |
| JP | 2002-2299661 A | 10/2002 |
| WO | PCT/EP1999/008573 | 5/2000 |

OTHER PUBLICATIONS

Alvin D. Compaan, Photovoltaics: Clean Power for the 21st Century, Solar Energy Materials & Solar Cells, 2006, pp. 2170-2180, vol. 90, Elsevier B.V.

(Continued)

*Primary Examiner* — Alexander Ghyka
(74) *Attorney, Agent, or Firm* — Hulsey, P.C.; John Ryan C. Wood; William N. Hulsey, III

(57) ABSTRACT

A front contact thin-film solar cell is formed on a thin-film crystalline silicon substrate. Emitter regions, selective emitter regions, and a back surface field are formed through ion implantation processes. In yet another embodiment, a back contact thin-film solar cell is formed on a thin-film crystalline silicon substrate. Emitter regions, selective emitter regions, base regions, and a front surface field are formed through ion implantation processes.

22 Claims, 20 Drawing Sheets

U.S. PATENT DOCUMENTS

| | | | |
|---|---|---|---|
| 5,024,953 | A | 6/1991 | Uematsu et al. |
| 5,073,230 | A | 12/1991 | Maracas et al. |
| 5,112,453 | A | 5/1992 | Behr et al. |
| 5,208,068 | A | 5/1993 | Davis |
| 5,248,621 | A | 9/1993 | Sano |
| 5,316,593 | A | 5/1994 | Olson et al. |
| 5,348,618 | A | 9/1994 | Canham et al. |
| 5,397,400 | A | 3/1995 | Matsuno et al. |
| 5,459,099 | A | 10/1995 | Hsu |
| 5,494,832 | A | 2/1996 | Lehmann et al. |
| 5,538,564 | A | 7/1996 | Kaschmitter |
| 5,645,684 | A | 7/1997 | Keller |
| 5,660,680 | A | 8/1997 | Keller |
| 5,681,392 | A | 10/1997 | Swain |
| 5,882,988 | A | 3/1999 | Haberern et al. |
| 5,928,438 | A | 7/1999 | Salami |
| 6,091,021 | A | 7/2000 | Ruby |
| 6,096,229 | A | 8/2000 | Shahid |
| 6,114,046 | A | 9/2000 | Hanoka |
| 6,127,623 | A | 10/2000 | Nakamura et al. |
| 6,204,443 | B1 | 3/2001 | Kiso et al. |
| 6,294,725 | B1 | 9/2001 | Hirschberg et al. |
| 6,331,208 | B1 | 12/2001 | Nishida et al. |
| 6,399,143 | B1 | 6/2002 | Sun et al. |
| 6,416,647 | B1 | 7/2002 | Dordi et al. |
| 6,429,037 | B1 | 8/2002 | Wenham et al. |
| 6,441,297 | B1 | 8/2002 | Keller et al. |
| 6,448,155 | B1 | 9/2002 | Iwasaki et al. |
| 6,461,932 | B1 | 10/2002 | Wang |
| 6,524,880 | B2 | 2/2003 | Moon et al. |
| 6,534,336 | B1 | 3/2003 | Iwane |
| 6,555,443 | B1 | 4/2003 | Artmann et al. |
| 6,566,235 | B2 | 5/2003 | Nishida et al. |
| 6,602,760 | B2 | 8/2003 | Poortmans et al. |
| 6,602,767 | B2 | 8/2003 | Nishida et al. |
| 6,613,148 | B1 | 9/2003 | Rasmussen |
| 6,624,009 | B1 | 9/2003 | Green et al. |
| 6,645,833 | B2 | 11/2003 | Brendel |
| 6,649,485 | B2 | 11/2003 | Solanki et al. |
| 6,653,722 | B2 | 11/2003 | Blalock |
| 6,664,169 | B1 | 12/2003 | Iwasaki et al. |
| 6,756,289 | B1 | 6/2004 | Nakagawa et al. |
| 6,881,644 | B2 | 4/2005 | Malik et al. |
| 6,946,052 | B2 | 9/2005 | Yanagita et al. |
| 6,964,732 | B2 | 11/2005 | Solanki |
| 7,022,585 | B2 | 4/2006 | Solanki et al. |
| 7,026,237 | B2 | 4/2006 | Lamb |
| 7,368,756 | B2 | 5/2008 | Bruhns et al. |
| 7,402,523 | B2 | 7/2008 | Nishimura |
| 2002/0153039 | A1 | 10/2002 | Moon et al. |
| 2002/0168592 | A1 | 11/2002 | Vezenov |
| 2002/0179140 | A1 | 12/2002 | Toyomura |
| 2003/0017712 | A1 | 1/2003 | Brendel |
| 2003/0039843 | A1 | 2/2003 | Johnson |
| 2003/0124761 | A1 | 7/2003 | Baert |
| 2004/0028875 | A1 | 2/2004 | Van Rijn |
| 2004/0173790 | A1 | 9/2004 | Yeo |
| 2004/0259335 | A1 | 12/2004 | Narayanan |
| 2004/0265587 | A1 | 12/2004 | Koyanagi |
| 2005/0160970 | A1 | 7/2005 | Niira |
| 2005/0172998 | A1 | 8/2005 | Gee et al. |
| 2005/0176164 | A1 | 8/2005 | Gee et al. |
| 2005/0177343 | A1 | 8/2005 | Nagae |
| 2005/0189015 | A1* | 9/2005 | Rohatgi et al. ............... 136/261 |
| 2005/0199279 | A1 | 9/2005 | Yoshimine et al. |
| 2005/0274410 | A1 | 12/2005 | Yuuki et al. |
| 2005/0281982 | A1 | 12/2005 | Li |
| 2006/0021565 | A1 | 2/2006 | Zahler et al. |
| 2006/0043495 | A1 | 3/2006 | Uno |
| 2006/0054212 | A1 | 3/2006 | Fraas et al. |
| 2006/0070884 | A1 | 4/2006 | Momoi et al. |
| 2006/0105492 | A1 | 5/2006 | Veres et al. |
| 2006/0196536 | A1 | 9/2006 | Fujioka |
| 2006/0231031 | A1 | 10/2006 | Dings et al. |
| 2006/0266916 | A1 | 11/2006 | Miller et al. |
| 2006/0283495 | A1 | 12/2006 | Gibson |
| 2007/0077770 | A1 | 4/2007 | Wang et al. |
| 2007/0082499 | A1 | 4/2007 | Jung et al. |
| 2008/0047601 | A1 | 2/2008 | Nag et al. |
| 2008/0157283 | A1 | 7/2008 | Moslehi |
| 2008/0210294 | A1 | 9/2008 | Moslehi |
| 2008/0264477 | A1 | 10/2008 | Moslehi |
| 2008/0289684 | A1 | 11/2008 | Moslehi |
| 2008/0295887 | A1 | 12/2008 | Moslehi |
| 2009/0042320 | A1 | 2/2009 | Wang et al. |
| 2009/0107545 | A1 | 4/2009 | Moslehi |
| 2009/0227094 | A1* | 9/2009 | Bateman et al. ............... 438/514 |
| 2009/0301549 | A1 | 12/2009 | Moslehi |
| 2010/0022074 | A1 | 1/2010 | Wang et al. |
| 2010/0116316 | A1 | 5/2010 | Moslehi et al. |

OTHER PUBLICATIONS

C. Berge, 150-mm Layer Transfer for Monocrystalline Silicon Solar Cells, Solar Energy Materials & Solar Cells, 2006, pp. 3102-3107, vol. 90, Elsevier B.V.

C. Oules et al, Silicon on Insulator Structures Obtained by Epitaxial Growth of Silicon over Porous Silicon, Journal of the Electrochemical Society, Inc., 1992, p. 3595, vol. 139, No. 12, Meylan Cedex, France.

C.S. Solanki, et al, Porous Silicon Layer Transfer Processes for Solar Cells, Solar Energy Materials & Solar Cells, 2004, pp. 101-113, vol. 83, Elsevier B.V., Leuven, Belgium.

C.S. Solanki, et al, Self-Standing Porous Silicon Films by One-Step Anodizing, Journal of Electrochemical Society, 2004, pp. C307-C314, vol. 151, The Electrochemical Society, Inc., Leuven, Belgium.

F. Duerinckx, et al, Reorganized Porous Silicon Bragg Reflectors for Thin-Film Silicon Solar Cells, IEEE Electron Device Letters, Oct. 2006, vol. 27, No. 10.

Francois J. Henley, Layer-Transfer Quality Cleave Principles, SiGen, Jul. 8, 2005 pp. 1-6, The Silicon Genesis Corporation, San Jose, California.

H.J. Kim, et al, Large-Area Thin-Film Free-Standing Monocrystalline Si Solar cells by Layer Transfer, Leuven, Belgium, IEEE.

J.H. Werner et al, From Polycrystalline to Single Crystalline Silicon on Glass, Thin Solid Films, 2001, pp. 95-100, vol. 383, Issue 1-2, Elsevier Science B.V., Germany.

J.J. Schermer et al., Epitaxial Lift-Off for large area thin film III/V devices, phys. Stat. sol. (a) 202, No. 4, 501-508 (2005).

Jianhua Zhao, et al, A 19.8% Efficient Honeycomb Multicrystalline Silicon Solar Cell with Improved Light Trapping, IEEE Transactions on Electron Devices, 1999, vol. 46, No. 10.

K. Van Nieuwenhuysen et al., Progress in epitaxial deposition on low-cost substrates for thin-film crystalline silicon solar cells at IMEC, Journal of Crystal Growth, 2006, pp. 438-441, vol. 287, Elsevier B.V., Leuven, Belgium.

K.L. Chopra et al., Thin-Film Solar Cells: An Overview, Progress in Photovoltaics: Research and Applications, 2004, pp. 69-92, vol. 12, John Wiley & Sons, Ltd.

Lammert et al., The Interdigitated Back Contact Solar Cell: A Silicon Solar Cell for Use in Concentrated Sunlight, IEEE Transactions on Electron Devices, pp. 337-342.

Macdonald et al., "Design and Fabrication of Highly Topographic Nano-imprint Template for Dual Damascene Full 3-D Imprinting," Dept. of Chemical Eng., University of Texas at Austin, Oct. 24, 2005.

Martin A. Green, Consolidation of Thin-Film Photovoltaic Technology: The Coming Decade of Opportunity, Progress in Photovoltaics: Research and Applications, 2006, pp. 383-392, vol. 14, John Wiley & Sons, Ltd.

Martin A. Green, Silicon Photovoltaic Modules: A Brief History of the First 50 Years, Progress in Photovoltaics: Research and Applications, 2005, pp. 447-455, vol. 13, John Wiley & Sons, Ltd.

Nobuhiko Sato et al, Epitaxial Growth on Porous Si for a New Bond and Etchback Silicon-on-Insulator, Journal of Electrochemical Society, Sep. 1995, vol. 142, No. 9, The Electrochemical Society, Inc., Hiratsuka, Japan.

P.J. Verlinden, et al, Sliver® Solar Cells: A New Thin-Crystalline Silicon Photovoltaic Technology, Solar Energy Materials & Solar Cells, 2006, pp. 3422-3430, vol. 90, Elsevier B.V.

P.R. Hageman et al., Large Area, Thin Film Epitaxial Lift Off III/V Solar Cells, 25th PVSC, 1996, May 13-17, Washington D.C., IEEE.

Photovoltaic Technology Research Advisory Council, A Vision for Photovoltaic Technology, 2005, pp. 1-41, European Commision Publications Office.

Prometheus Institute, U.S. Solar Industry Year in Review: U.S. Solar Energy Industry Charging Ahead, (SEIA) The Solar Energy Industry Association.

R. Brendel, et al, Sol-Gel Coatings for Light Trapping in Crystalline Thin Film Silicon Solar Cells, Journal of Non-Crystalline Solids, 1997, pp. 391-394, vol. 218, Elsevier Science B.V., Germany.

Richard Auer et al, Simplified Transfer Process for High-Current Thin-Film Crystalline Si Solar Modules, 3rd World Conference on Photovoltaic Energy Conversion, May 11-18, 2003, Osaka, Japan.

Richard M. Swanson, A Vision for Crystalline Silicon Photovoltaics, Progress in Photovoltaics: Research and Applications, 2006, pp. 443-453, vol. 14, John Wiley & Sons, Ltd.

Rolf Brendel, A Novel Process for Ultrathin Monocrystalline Silicon Solar Cells on Glass, 14th European Photovolaic Solar Energy Conference, Jun. 30-Jul. 4, 1997, Barcelona, Spain.

Rolf Brendel, Review of Layer Transfer Processes for Cystalline Thin-Film Silicon Solar Cells, The Japan Journal of Applied Physics, 2001, pp. 4431-4439, vol. 40, Part 1, No. 7, The Japan Society of Applied Physics, Japan.

Rolf Brendel, Thin-Film Crystalline Silicone Mini-Modules Using Porous Si for Layer Transfer, Solar Energy, 2004, pp. 969-982, vol. 77, Elsevier Ltd., Germany.

S. Hegedus, Thin Film Solar Modules: The Low Cost, High Throughput and Versatile Alternative to Si Wafers, Progress in Photvoltaics: Research and Applications, 2006, pp. 393-411, vol. 14, John Wiley & Sons, Ltd.

Takao Yonehara, et al, Epitaxial Layer Transfer by Bond and Etch Back of Porous Si, Applied Physics Letter 64, Apr. 18, 1994, vol. 16, American Institute of Physics.

Toshiki Yagi, et al, Ray-Trace Simulation of Light Trapping in Silicon Solar Cell with Texture Structures, Solar Energy Materials & Solar Cells, 2006, pp. 2647-2656, vol. 90, Elsevier B.V.

* cited by examiner

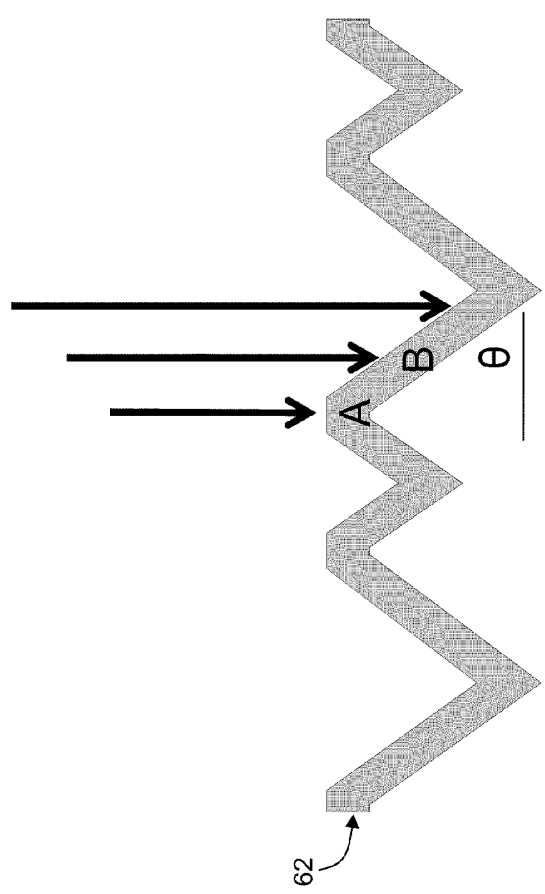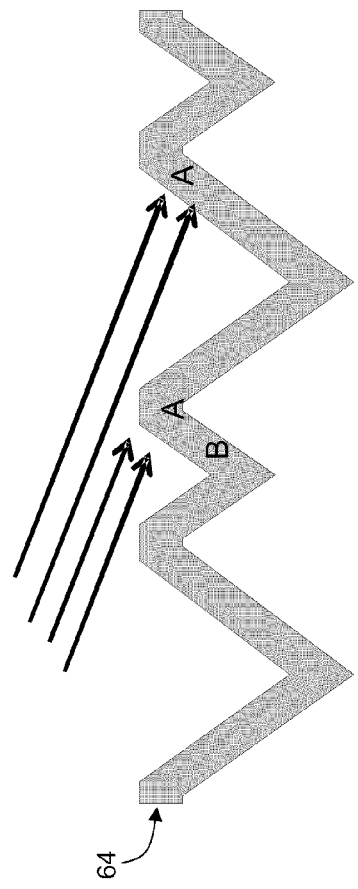
FIGURE 6
FIGURE 7

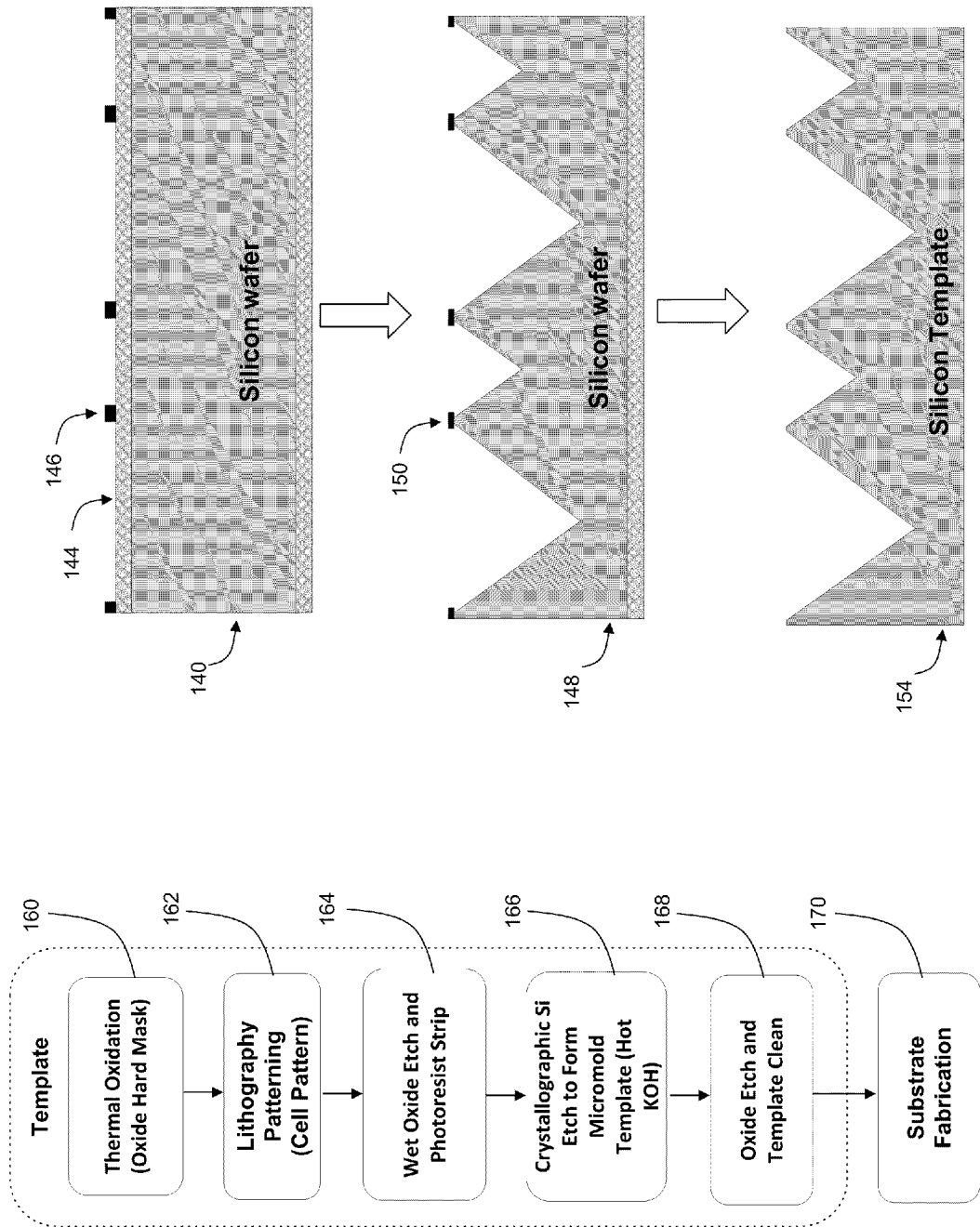

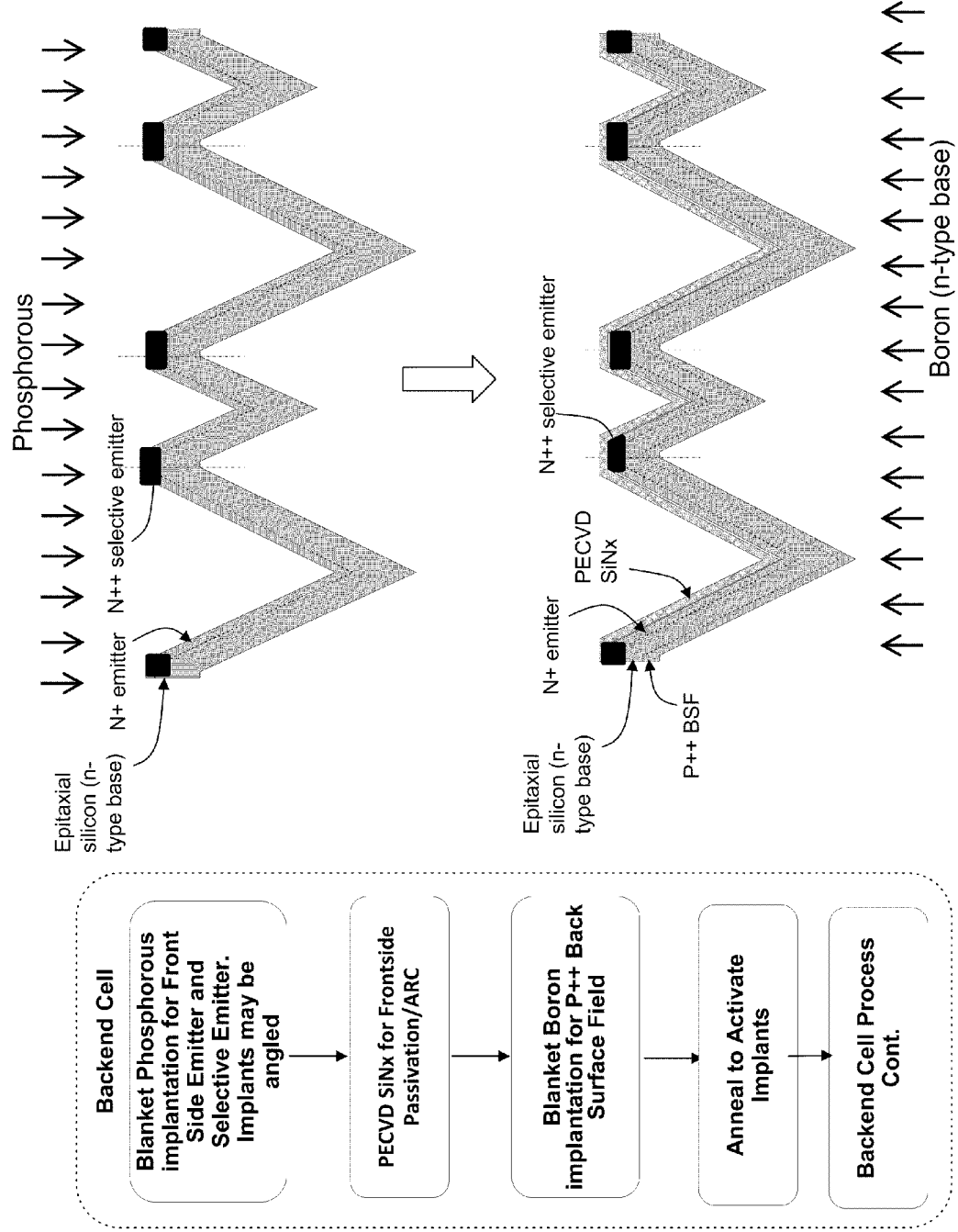

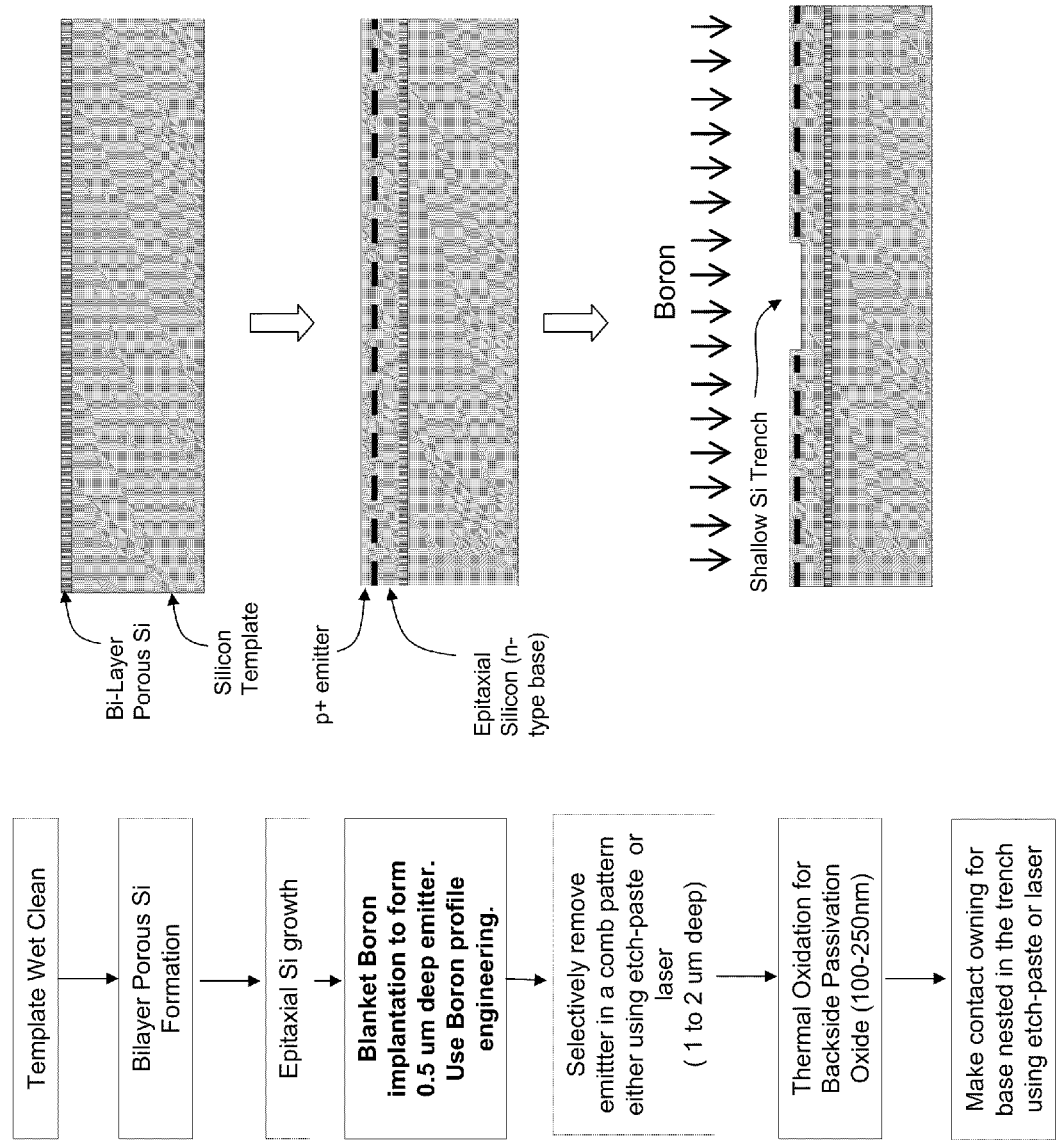

ION IMPLANTATION FABRICATION PROCESS FOR THIN-FILM CRYSTALLINE SILICON SOLAR CELLS

CROSS-REFERENCE TO RELATED U.S. APPLICATIONS

This application also claims the benefit of provisional patent application 61/175,698 filed on Apr. 5, 2009, which is hereby incorporated by reference in its entirety.

FIELD

This disclosure relates in general to the field of photovoltaics and solar cells, and more particularly to methods for manufacturing thin-film solar cells (TFSCs). More particularly, the present disclosure provides ion implantation applications for manufacturing Thin-Film Crystalline Silicon Solar Cells (TFSC).

BACKGROUND

Ion implantation involves implantation of ions of certain elements into a solid and is a standard technique used in the fabrication of semiconductor devices. The implantation of dopant atoms such as phosphorous (P), arsenic (As), and boron (B) are used to form semiconductor P/N junctions, while the implantation of oxygen is used in silicon-on-oxide (SOI) devices. In current manufacturing methods for thin-film crystalline silicon solar cell (TFSC), either planar or three dimensional cells, the p-n junctions are often formed by either POCl3-based doping, or a phosphorous compound deposition or spray-on followed by annealing. Additionally for thin film crystalline silicon (c-Si) substrates obtained using epitaxial deposition the emitter may be formed is-situ by depositing a highly doped surface layer of desired doping type, either P or N.

There are reports of utilizing ion implantation of P and B for forming emitters in a p-type or n-type silicon substrate, respectively followed by a suitable annealing treatment to form a solar cell. However, these ion implantation efforts have been limited to planar, thick c-Si wafers (typically ≧200 um).

High efficiency c-Si solar cells have been made on very thin wafers, down to 45 um, by thinning down the conventional c-Si wafers from bulk silicon ingots or bricks, using integrated circuits (IC) packaging techniques such as chemical mechanical polishing. However, this approach is not practical because of the high cost. Crystalline Silicon (C-Si) Thin-Film Solar Cells (TFSC), of thickness less than 150 um may be advantageously made by depositing a thin layer of c-Si on a suitable substrate or by slicing a c-Si ingot into thin wafers using advanced wire sawing or other known techniques such as hydrogen implantation followed by annealing to cause thin wafer separation.

Often, high performance thin-film silicon substrates (TFSS) are made by depositing an epitaxial crystalline silicon layer according to chemical vapor deposition (CVD) process. Solar cells created in this epitaxial silicon deposition method may be planar or have a well defined structure. Although, in principle, any three-dimensional surface structure is possible for 3-D cells, various performance limitations make certain 3-D structures more advantageous—such as pyramidal or prism based three-dimensional crystalline silicon structures.

The current standard technique for the formation of selective emitters involves several steps. Usually, the full front surface of a p-type wafer is lightly doped using the POCl3 based process or a process involving spraying a phosphorous-compound followed by anneal. Then a passivating dielectric is deposited on the front surface of the silicon substrate. The regions that are desired to be metallization contacts are then selectively opened in this dielectric, usually by a laser ablation or an etch gel process. A second doping process is then carried out to selectively dope these localized regions with a high concentration of phosphorous. However, this process is often lengthy, costly, and inefficient.

When forming homogeneous emitter layers on a TFSS, controlling the dopant profile may provide higher efficiency. To maximize current collection from the solar cell, a good 'blue response' is required. This requires the maximum phosphorous content near the surface to not exceed 1E21 cm-3 and the depth of the highly phosphorous doped region to be low, preferably 0.1 um or less and the total depth of the phosphorous doped region to be preferably in the range of 0.3 to 0.5 um. Because of this, there is a growing need in the solar industry for shallow emitters. However, the current industrial emitter formation processes, such as POCl3-based doping, phosphosilicate (PSG) deposition, or phosphoric acid spray-on followed by in-line anneal, do not provide control of the phosphorous concentration and depth independently. Thus, the emitter characteristics are solely determined by the temperature and time used for the doping anneal. This method does not provide good control of the dopant profile for the emitter.

Further, the lifetime of minority charge carriers is greatly reduced at concentrations above 1E18 cm-3. For maximum blue response this would appear to be the upper limit of the dopant concentration in the emitter. However, this would lead to very high emitter sheet resistance and high series resistance and low fill factor (FF) and low current density (Jsc). Therefore, a thin higher doped region near the surface is desired. However, current dopant profile controlling methodology is limited in controlling the thickness of this highly doped region.

SUMMARY

Therefore a need has arisen for a simplified manufacturing method for forming a thin-film crystalline silicon solar cell. The method must include improved methods for forming emitter regions, base regions, and back/front surface fields in shallow surface regions of thin-film crystalline silicon solar cells.

In accordance with the disclosed subject matter, applications of ion implantation in the manufacturing of thin-film crystalline silicon (c-Si) solar cells are provided that substantially reduce disadvantages of prior art methods.

A front contact thin-film solar cell is formed on a thin-film crystalline silicon substrate. Emitter regions, selective emitter regions, and a back surface field are formed through ion implantation processes. In yet another embodiment, a back contact thin-film solar cell is formed on a thin-film silicon substrate. Emitter regions, selective emitter regions, base regions, and a front surface field are formed through ion implantation processes.

In yet another embodiment, three-dimensional thin-film crystalline silicon substrates are used to form three-dimensional thin-film crystalline silicon solar cells. The three-dimensional structure of the substrates is utilized to obtain selective doping (selective emitter) using implants that are either normal to the plane of the TFSC, or are angled. The ion implantation is used to make variable conductivity emitter junction regions in 3D TFSC solar cells for the purpose of self-aligned selective emitter fabrication.

Alternatively, ion implantation is used to make homogeneous emitters in front contacted in TFSC. The ion implantation is used to independently control the dopant concentration and the dopant depth, i.e., profile engineering of emitter to maximize the solar cell performance.

The ion implantation is used to make homogeneous back surface field (BSF) in front contacted cells. The three dimensional structure of the cells is again utilized to obtain selective doping (for point contacts) using implants that are either normal to the plane of the TFSC or are angled.

Technical advantages of the disclosed method include improving the surface passivation by suitably charging the overlying dielectric using ion implantation The negative charge of the films in contact with boron doped surfaces can be improved by doping them with boron to improve surface passivation.

Further, the disclosed ion implantation methods may be used to selectively retard oxidation to obtain localized non-oxidized regions for metal point contacts on the back side of the TFSC.

Additionally, the ion implantation applications disclosed may be used to make solar cells with the standard configuration (known as a front contact solar cell) of contacts on the front and back surface of the cell, or the an alternative configuration (known as a back contact solar cell) where all the contacts are on the backside of the solar cells. Back contact solar cells may be best designed as inter-digitated back contact solar cells.

These and other advantages of the disclosed subject matter, as well as additional novel features, will be apparent from the description provided herein. The intent of this summary is not to be a comprehensive description of the subject matter, but rather to provide a short overview of some of the subject matter's functionality. Other systems, methods, features and advantages here provided will become apparent to one with skill in the art upon examination of the following FIGURES and detailed description. It is intended that all such additional systems, methods, features and advantages included within this description, be within the scope of the claims of subsequently filed applications based on this provisional.

BRIEF DESCRIPTION OF THE DRAWINGS

The features, nature, and advantages of the disclosed subject matter will become more apparent from the detailed description set forth below when taken in conjunction with the accompanying drawings, wherein:

FIG. 6 shows an ion implantation process for variable doping on pyramidal three-dimensional TFSS;

FIG. 7 shows an angled ion implantation process on pyramidal three-dimensional TFSS;

FIGS. 11A through 11B FIG. 11A show a process flow for the formation of a three-dimensional substrate for forming a crystalline thin-film silicon solar cell;

FIGS. 12A through 13D show the process flow for the formation of a front contact crystalline thin-film silicon solar cell in accordance with the disclosed subject matter;

FIGS. 16A through 16H show the process flow for the formation of a back contact planar crystalline thin-film silicon solar cell in accordance with the disclosed subject matter.

DETAIL DESCRIPTION

Figure 2A:
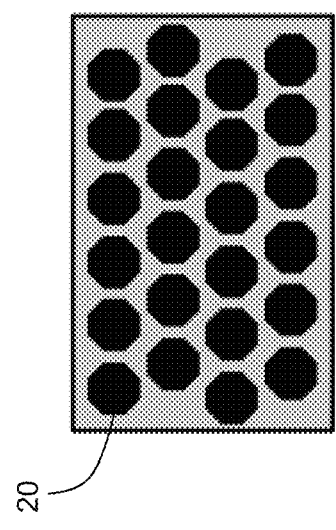
FIGS. 2A and 2B show a top and cross-sectional view, respectively, of an example of a three-dimensional thin-film crystalline silicon substrate (TFSS) with prism surface features.

The following description is not to be taken in a limiting sense, but is made for the purpose of describing the general principles of the present disclosure. The scope of the present disclosure should be determined with reference to the claims. And although described with reference to the manufacture of planar thin-film solar cells and three-dimensional thin-film solar cells with pyramidal and prism surface features, a person skilled in the art could apply the principles discussed herein to the manufacture of all structural types of thin-film solar cells.

Although described with reference to specific embodiments, one skilled in the art could apply the principles discussed herein to other areas and/or embodiments. A preferred semiconductor material for the 3-D TFSS is crystalline silicon (c-Si), although other semiconductor materials may also be used. One embodiment uses monocrystalline silicon as the thin film semiconductor material. Other embodiments use multicrystalline silicon, polycrystalline silicon, and/or a combination thereof. The designs here are also applicable to other semiconductor materials including but not limited to germanium, silicon germanium, silicon carbide, a crystalline compound semiconductor, or a combination thereof. Additional applications include copper indium gallium selenide (CIGS) and cadmium telluride semiconductor thin films.

Further, in this application the term "front" and "back" are used to refer to the surface facing the incoming photons and away from the photons, respectively. A front contact solar cell, or frontside contact, is one that has metal contacts on the solar cell side facing towards the light. A back contact solar cell, or backside contact, is one where all the metal contacts are on the solar cell side facing away from the light. It should be noted that the so called "front contact" cells have metal contacts on back also.

Although the disclosure describes phosphorous ion implantation to form emitters and born implantation to form BSFs for p-type TFSCs, the same principles apply to B implantation to form emitters and P implantation to form BSFs for n-type TFSCs.

Although the disclosure has typically described P and B implantation for n and p doping, respectively, other elements such as As and Sb may be used for n doping, and Al, Ga, In, may be used for p doping.

Those with skill in the arts will recognize that the disclosed embodiments have relevance to a wide variety of areas in addition to those specific examples described below.

The present disclosure describes the use of ion implantation technique in the manufacture of 3-dimensional thin-film crystalline silicon solar cells (TFSC), including those with pyramidal and prism unit cell structures. The present disclosure also describes the use of ion implantation technique in the manufacture of planar thin film crystalline silicon (c-Si) solar cells (TFSC). The present disclosure describes the use of ion implantation to form emitter regions, selective emitter regions, base regions, back surface fields, and front surface fields in a TFSC and the application of ion implantation methods to form the p-n junction for TFSC.

Further, the present disclosure enables the use of ion implantation to independently control the dopant concentration and the dopant depth for emitter. The dopant profile control, sometimes referred to as profile engineering of emitters, is used to maximize the solar cell performance including but not limited to blue response, Voc, and current collection.

Figure 1A:
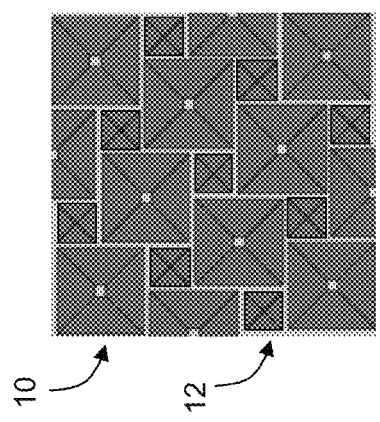
FIGS. 1A and 1B show a top and cross-sectional view, respectively, of an example of a pyramidal three-dimensional thin-film crystalline silicon substrate (TFSS)
Figure 1B:
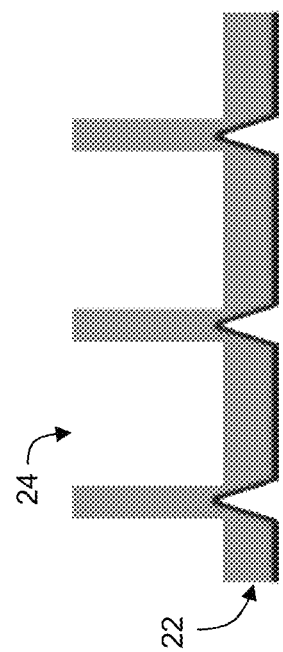

FIGS. 1A and 1B show a top and cross-sectional view, respectively, of an example of a pyramidal three-dimensional thin-film silicon substrate (TFSS), which also may be referred to as a wafer. FIG. 1A is a top view of an embodiment of a pyramidal TFSS comprised of large pyramidal cavities 10 and small pyramidal cavities 12 on a silicon substrate. FIG. 1B is a cross-section of the substrate shown in FIG. 1A, substrate 14, showing small pyramidal cavities 16 and large pyramidal cavities 18. It should be noted that the pyramidal structures may have flat top and bottom regions or may end in an angled apex/tips (as shown in FIG. 1B).

Figure 2B:
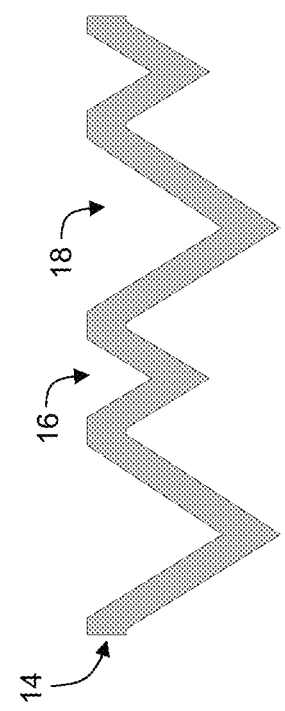

FIGS. 2A and 2B show a top and cross-sectional view, respectively, of an example of a three-dimensional thin-film silicon substrate (TFSS) with prism surface features. FIG. 2A is a top view of an embodiment of a prism TFSS comprised of hexagonal prism structures 20 on a silicon substrate. FIG. 2B is a cross-section of the substrate shown in FIG. 2A, substrate 22, showing hexagonal prism cavities 24.

One method for forming planar or three-dimensional TFSSs involves using an initial thick wafer as a substrate. The substrate may be mono- or multi-crystalline. To obtain a 3-D structure, the substrate surface may be patterned using techniques such as lithography followed by wet etch. Next, a porous silicon structure is created on the surface. This is followed by epitaxially depositing the desired thickness of the silicon using techniques such as chemical vapor deposition (CVD). The epitaxial silicon layer is then dislodged from the porous silicon layer by mechanical or chemical means. This results in a wafer with a desired thickness and a planar or 3-D structure. The example thin-film silicon substrates shown in FIGS. 1 and 2 may be formed using this method.

In one embodiment, the present disclosure employs thin film solar cells that have a three-dimensional structure where a desired structural pattern has been formed using MEMS type processing.

Figure 3:
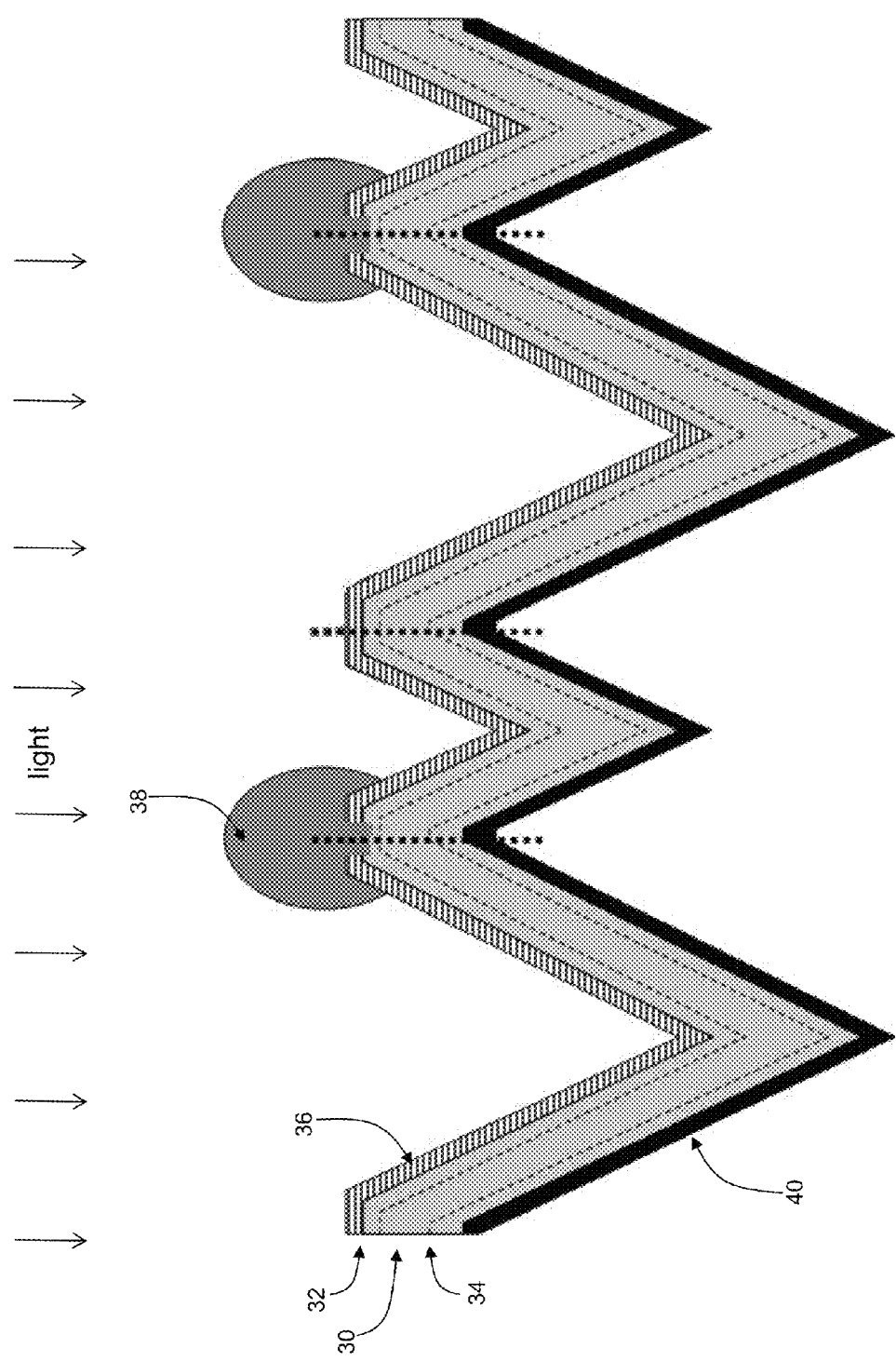
FIG. 3 illustrates a pyramidal three-dimensional thin-film crystalline solar cell with a standard configuration of frontside and backside contacts.

FIG. 3 illustrates a pyramidal three-dimensional thin-film solar cell with a standard configuration of frontside (the solar cell side facing the light) and backside contacts positioned on the surface of the cell. P-type (P+) base 30, often an epitaxial silicon layer, has been doped according to an ion implantation process to create N-type (N+) emitter layer 32 and p-type (P++) back surface field 34. Emitter metal 38 and base metal 40 is screen printed or an electroplated or electroless plated single or multilayer high-conductivity metallized regions (silver, aluminum, nickel, titanium, cobalt, or tantalum)— shown, typically emitter metal 38 is silver and base metal 40 is aluminum. Alternatively, the metal layer could be inkjet dispensed. Anti-reflection coating 36 may also serve as a frontside passivation layer given a controlled thickness. In this embodiment, the emitter metal contacts are formed in continuous metal lines, i.e. fingers and busbars on the 3-D TFSC top surface. The back side metal can be deposited or applied as a blanket film directly on the silicon surface after forming the BSF as shown in FIG. 3. Alternatively, the back surface can be passivated with a dielectric and the back side blanket metal makes localized contacts to the pyramidal tips. For screen printed aluminum this is made by firing the metal through the dielectric or opening contacts before metal deposition. For localized contacts the locally highly doped pyramid tips are advantageous.

The following describes the formation of N+ emitter for a p-type base c-Si TFSC material. The same procedures may be used to make P+ emitter for an n-type base c-Si TFSC material. To form an N+ emitter in a p-type silicon TFSC, the dopant species may be P, As, and Sb, while B, Al, Ga, and In may be used to form P+ emitter in an n-type silicon TFSC substrate.

Ion implantation of P and B for forming the emitter in a p-type and n-type silicon, respectively, followed by a suitable annealing treatment, have been shown to yield solar cells with high efficiency. The present disclosure provides a similar P and B ion implantation combined with a suitable annealing treatment to form emitters in thin-film planar and three-dimensional solar cells in p-type or n-type silicon, respectively.

In one embodiment, the ion implantation methods for forming a homogenous emitter layer 32 and back surface field 34 include forming a homogeneous phosphorous doped emitter in the front surface of the substrate by using ion implantation after manufacturing a 3-D thin-film c-Si p-type wafer. The back surface field is created by implanting a P-type dopant such as boron. The cell is then completed using standard passivation and metallization techniques.

Figure 4:
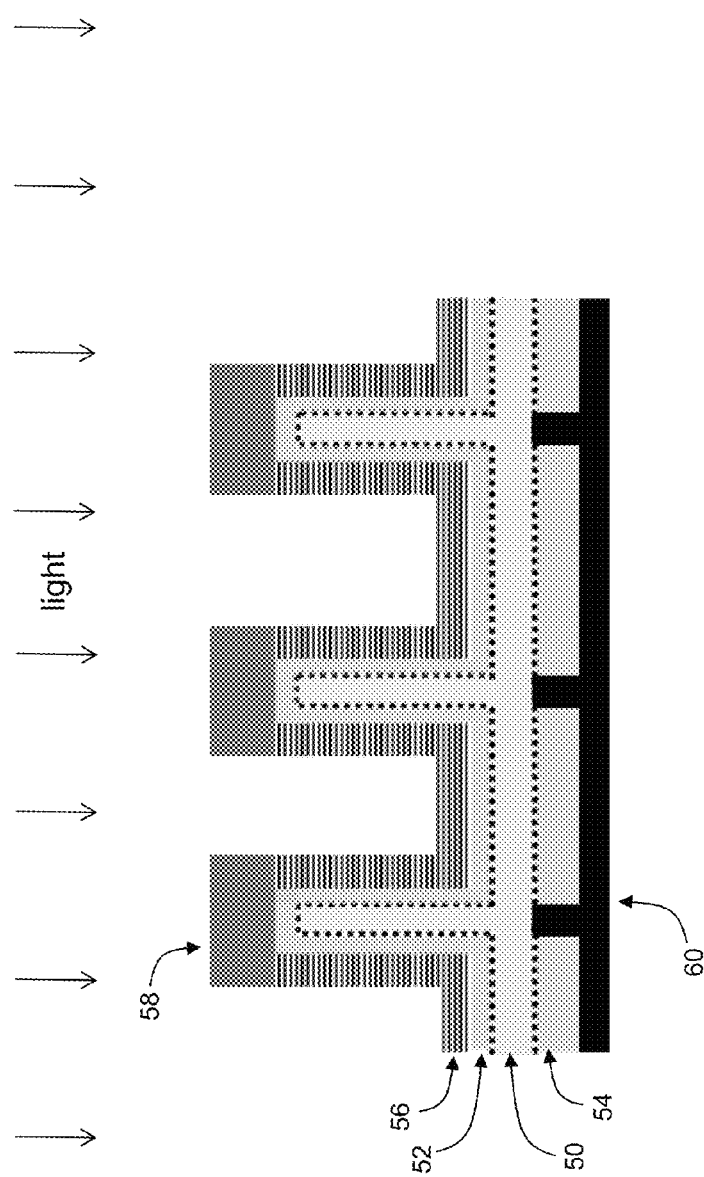
FIG. 4 illustrates a prism three-dimensional thin-film crystalline solar cell with a standard configuration of frontside and backside contacts.

FIG. 4 illustrates a prism three-dimensional thin-film solar cell with a standard configuration of frontside (light side) and backside contacts positioned on the surface of the cell. P-type (P+) base 50, often an epitaxial silicon layer, has been doped according to an ion implantation process to create N-type (N+) emitter layer 52. Back surface dielectric 54 acts as a passivation layer. Shown, emitter metal 58 is silver and base metal 60 is aluminum. Anti-reflection coating 56 is an optical coating is an optical coating applied to the surface of the TFSC to reduce reflection.

As in FIG. 3, emitter layer 52 may be created using phosphorous implantation and back surface dielectric 54 may be created using boron implantation. The wafer surface could be angled and rotated to get uniform implantation on the side walls of the prism structure. The TFSC depicted in FIG. 4 shows the metal to contact the back surface through a number of localized contacts opened in the back surface dielectric. The contact resistance of these contacts may be lowered using boron implantation. Alternatively, instead of these localized contacts a back surface field may be created using boron implantation.

For homogeneous emitter layers, using blanket implantation control of the dopant profile can provide higher efficiency. To maximize current collection from the solar cell, a good 'blue response' is required. This requires the maximum phosphorous content near the surface to be less than 1E21 cm-3 and the depth of the emitter to be preferably in the range of 0.3 to 0.5 um. Hence, the solar industry is moving to shallow emitters. However, the current industrial emitter formation processes, such as POCl3-based doping or PSG deposition or phosphoric acid spray-on followed by in-line anneal, do not provide the control of the phosphorous concentration and depth independently. The emitter characteristics are solely determined by the temperature and time used for the doping anneal. On the other hand, ion implantation provides the ability to make shallow junctions of desired dopant concentrations by the control of ion dose and energy. The use of the disclosed ion implantation process thus makes it possible to obtain emitters with the desired surface dopant concentration, profile, and depth. Implanted emitters also eliminate the phosphorus dead layer and other complications commonly associated with POCl3-doped emitters.

Figure 5:
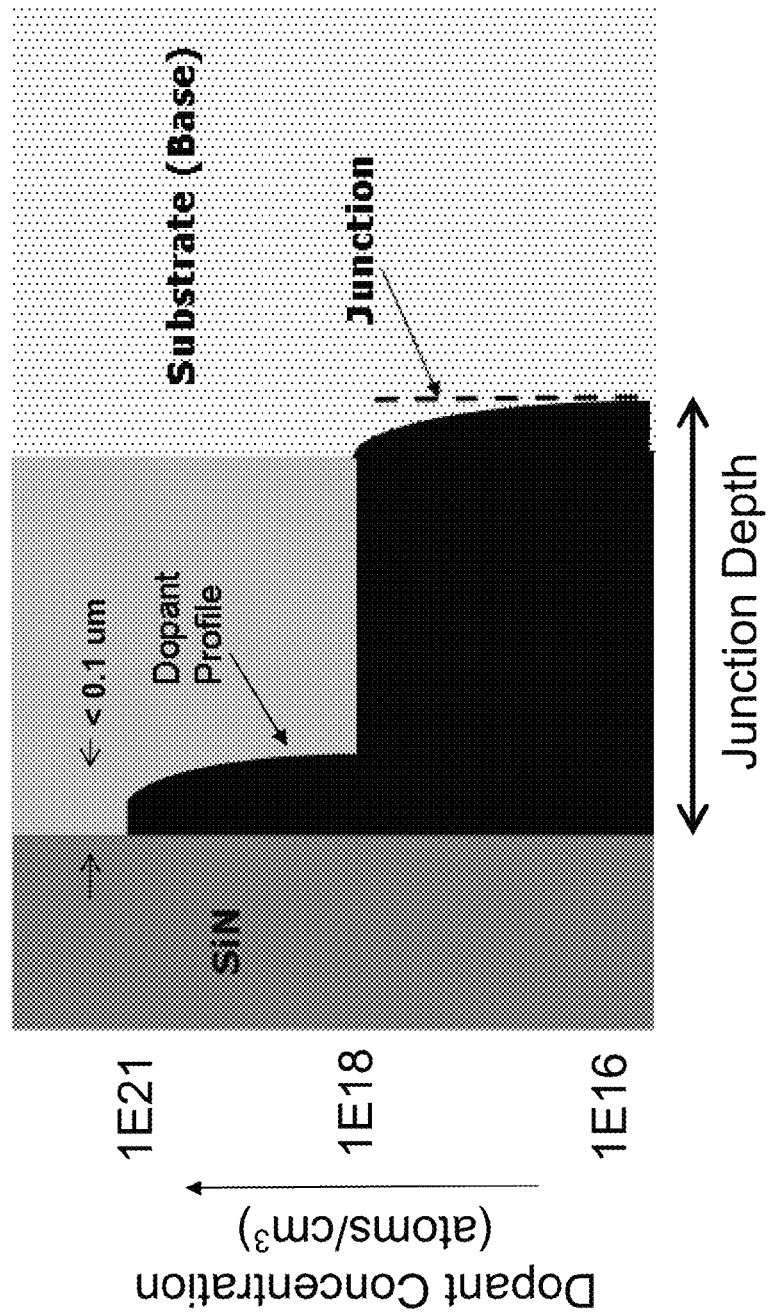
FIG. 5 is a graph representing an idealized dopant profile for homogeneous emitters.

FIG. 5 is a graph representing an idealized dopant profile for homogeneous emitters in dopant concentration (atoms/cm$^3$) over junction depth. Such a precise control of the dopant profile, sometimes referred to as profile engineering, may be only possible using a precision technology such as ion implantation. Shown, a very thin layer (<0.1 um) near the surface of the wafer has a high dopant concentration (up to 1e21/cm3) while the rest of the emitter has a dopant concentration close to 1E18 atoms/cm3.

Alternatively, higher efficiency of solar cells may be obtained using the 'selective emitter' approach. The current standard technique for the formation of selective emitters involves several steps. First, the full front surface of a p-type wafer is lightly doped using the POCl3 based process or a process involving spraying a phosphorous-compound followed by anneal. Then a passivating dielectric is deposited on the front surface. The regions that are desired to be contacted by metal are then selectively opened in this dielectric, either using laser ablation or etch gel. A second doping process is then carried out to selectively dope these localized regions with a high concentration of phosphorous. However, this process is often lengthy and costly.

FIG. 6 shows an ion implantation process for variable doping on pyramidal three-dimensional TFSS 62. Shown, pyramidal three-dimensional TFSS 62 has inverted pyramidal cavity walls aligned along the (111) crystallographic plane—thus θ is about 54.7°. The relative angular orientation of the implanted surface with respect to the incoming ion beam makes it possible to obtain a desired, variable doping by using an ion implantation process for doping the pyramidal three-dimensional TFSS 62. The regions on the 3-D TFSS which have surfaces perpendicular to the incident ion beam are heavily doped, such as Region A, thus, creating a lower sheet resistance junction. However, regions on the 3-D TFSS which receive ions at an angle, such as the (111) inverted pyramidal cavity wall surfaces, shown as Region B, are doped effectively at a lighter dose, thus, creating a higher sheet resistance junction. Since the (111) surface (or any oblique orientation surface) is inclined at angle θ (which is the angle with respect to the flat horizontal surfaces—or flat surfaces that are aligned along the (100) crystallographic plane and θ is about 54.7°), the dopant concentration is reduced to cos θ of the horizontal surface. After the deposition of a passivating dielectric such as SiN:H, only the selectively highly doped ledges of Region A on top of the 3D TFSS (or a fraction of them) are then contacted by metal for emitter contact metallization. This may be carried out by using one the several techniques such: as an Ag paste that etches through the passivating dielectric; by making openings using laser ablation of the passivating dielectric: by removal using etch paste, followed by plating-based and/or PVD metal deposition. Thus, the ion implantation process for variable doping to form selective emitters on the 3-D structure shown facilitates one step selective doping and the formation of dual-doped emitter junctions without a need for a more complex process flow using lithography or other patterning techniques.

FIG. 7 shows an angled ion implantation process on pyramidal three-dimensional TFSS 64. This ion implantation process may be used to selectively dope the regions around the tips/ledges of the three-dimensional surface features (shown as Region A) of TFSS 64. The low doped emitter is first uniformly formed using an implantation direction normal to the plane of the TFSS 64 or by standard industrial techniques. Next, angled ion implantation is used to selectively heavily dope the tips of the structure (Region A in FIG. 7) which are then selectively contacted by the metal.

The present disclosure also describes implantation of B and P ions to produce suitable back surface field (BSF) in thin-film planar and three dimensional solar cells in p-type or n-type silicon, respectively.

The current industrial practice of making the back surface field (BSF) using Al-paste firing and forming the Al—Si alloy to provide the P+ layer has severe limitations. The p/p+ interface is not sharp but is instead diffused—resulting in low reflectivity for minority carrier electrons. The Si/Al—Si interface is also diffused, resulting in low optical reflectivity for long wavelength photons. Additionally, there are manufacturing problems such as the low conductivity of Al paste and the wafer bow resulting from the intimate mixing of the thick paste with silicon wafer. Using the implantation of B ions for p-type substrates (and P for n-type) eliminates these issues. As explained above for emitters, a sharp BSF of a desired profile may be easily obtained using the ion implantation methods of the present disclosure.

To achieve uniform doping of the ledges of the 3-D TFSC, the wafer may be rotated during implantation so that all sides or faces of the structure are uniformly doped.

Similar to the profile engineering disclosed above for the emitter, any desired profile of BSF may be obtained. The structure of 3-D TFSC may be used to obtain selective doping for the BSF. The heavily doped tips are then selectively contacted by a back metal, such as aluminum.

Similar to the case of emitter formation discussed in above, an angled ion implantation of the 3-D TFSC may be also used to obtain selective doping for the BSF. The heavily doped tips are then selectively contacted by back metal.

After the formation of the emitter and BSF, either homogeneously or selectively doped, the implant anneal process may be combined with oxidation to produce high quality front and back passivation of cells.

It is known that the passivation on N+ surfaces is enhanced when the passivating dielectric has extra positive charge. The SiN:H typically used in the solar industry has a surplus positive charge which, when controlled properly, can help provide superior passivation of N+ surfaces. Similarly, the dielectric layer passivating the back surface field may be implanted with a negatively charged ion to further reduce the surface recombination due to the field effect.

The ion implantation methods of the present disclosure may also be used to obtain localized openings in the dielectric layer for metal contacts. For this, the tips or ledges of the 3-D TFSC are selectively implanted with an ion species, such as nitrogen, that retards/slows the growth of oxide during a subsequent thermal oxidation process. During oxidation the passivating oxide grows everywhere except for these high, tip regions which have been selectively implanted. The small amount of SiN formation due the implantation of N is easily removed in a cleaning sequence involving dilute HF followed by phosphoric acid etch. These regions are then selectively contacted by metal. On the front surface the selectively opened regions can be selectively contacted with metal using plating, ink-jet or other techniques. This facilitates the optimization of front metal pattern to improve the cell performance. On the back side these regions can be selectively plated or contacted upon the blanket deposition of aluminum using PVD or evaporation schemes. Such localized contact scheme leads to the well know PERL (passivated emitter and rear locally diffused) type of cell structure and with it well known performance benefits.

Figure 8:
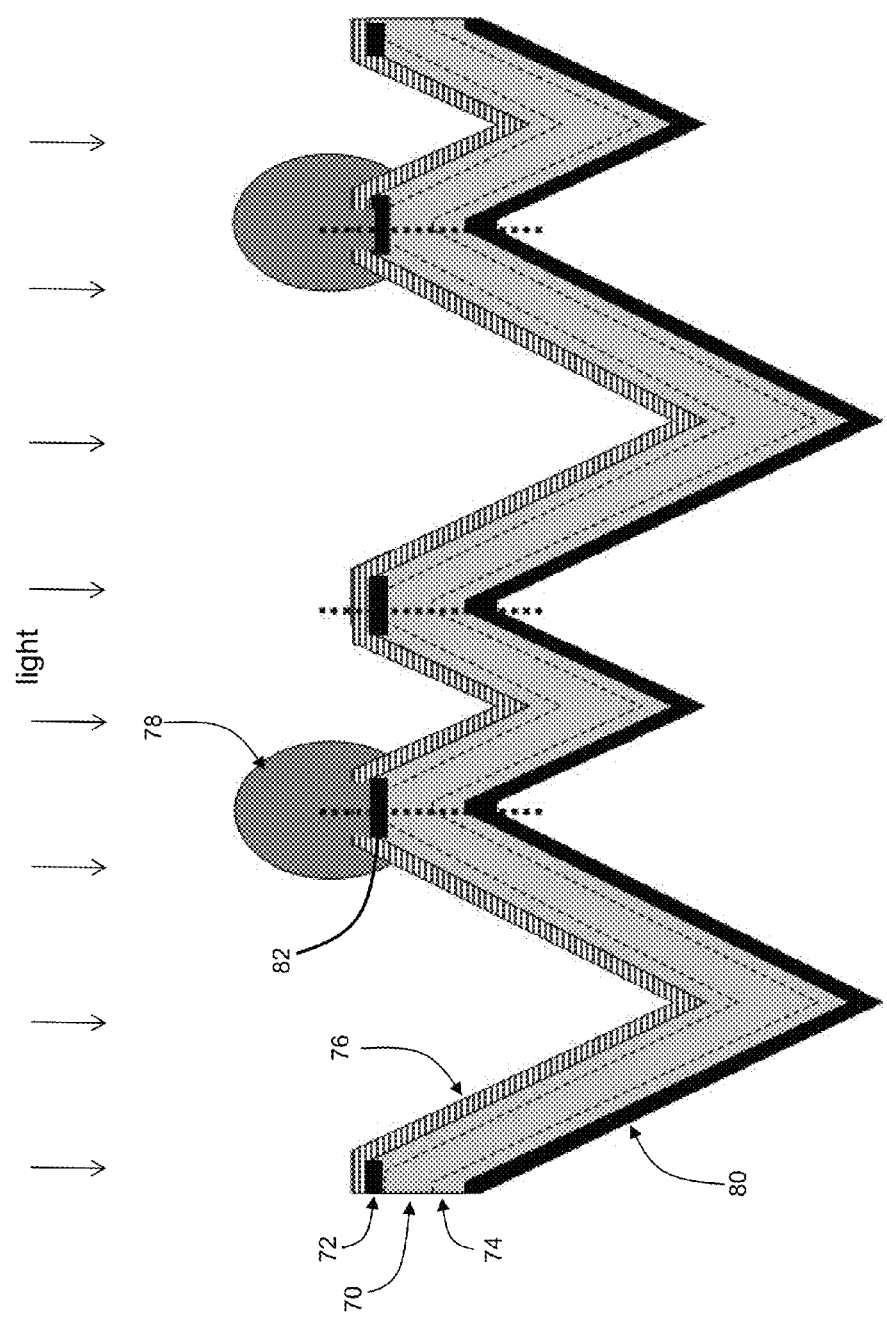
FIG. 8 illustrates a pyramidal three-dimensional thin-film solar cell with selective frontside emitters.

FIG. 8 illustrates a pyramidal three-dimensional thin-film solar cell with selective frontside emitters. P-type base 70, an epitaxial silicon layer, has been doped according to an ion implantation process to create N-type (N+) emitter layer 72 and p-type (P++) back surface field 74. Selective emitter (N++) 82 is formed through an angled ion implantation process. The cell is then completed using standard passivation and metallization techniques to form emitter metal contacts 78 (silver) and base metal contacts 80 (aluminum). Anti-reflection coating 76 is an optical coating is an optical coating applied to the surface of the TFSC to reduce reflection. FIGS. 11A-13D depict a detailed process flow describing the formation of the three-dimensional thin-film solar cell shown in FIG. 8.

Figure 9:
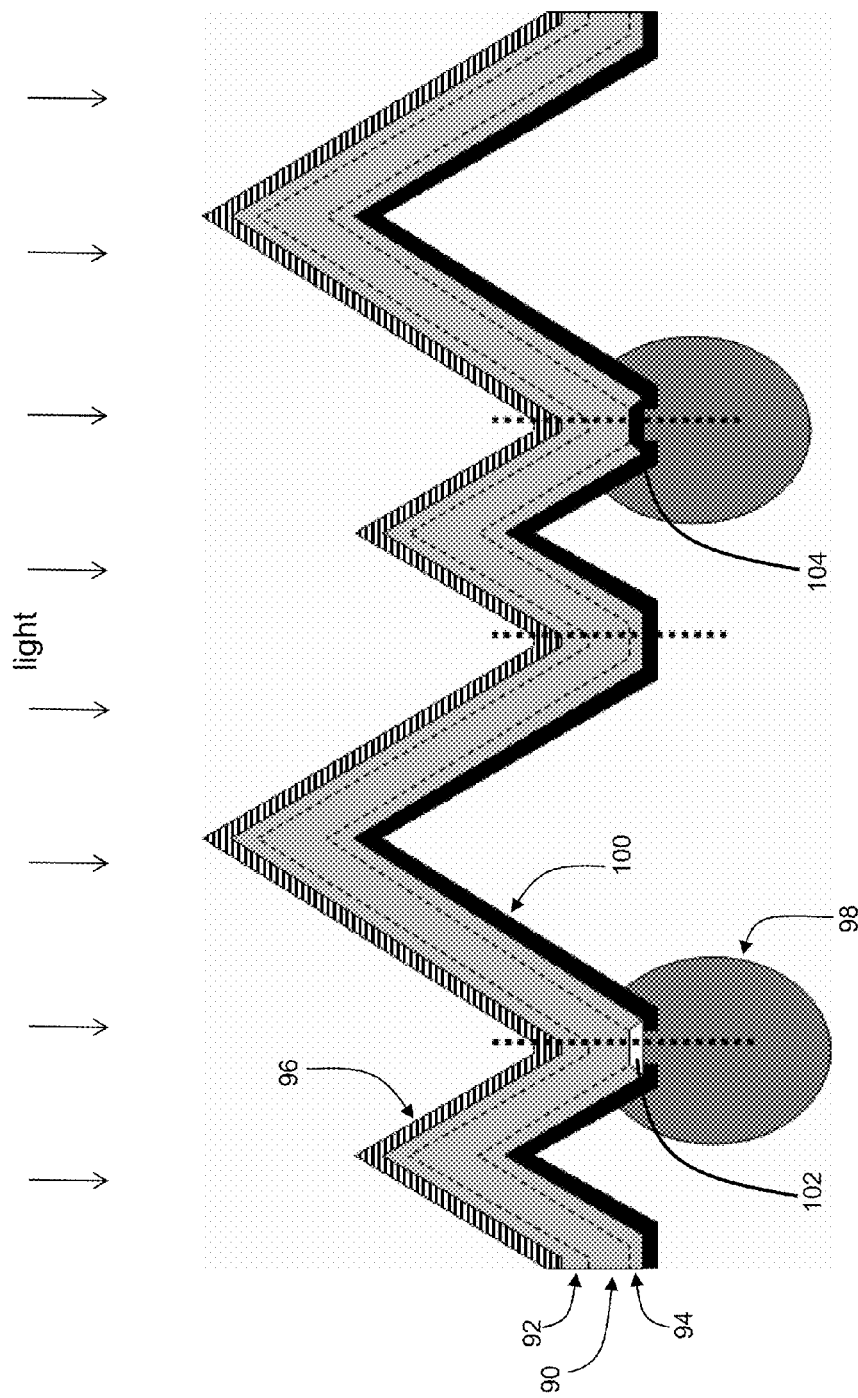
FIG. 9 illustrates a pyramidal three-dimensional thin-film solar cell with all backside contacts.

FIG. 9 illustrates a pyramidal three-dimensional thin-film solar cell with all backside contacts. N-type base 90, an epitaxial silicon layer, has been doped according to an ion implantation process to create N-type (N+) front side field 92 and p-type (P+) emitter layer 94. Selective emitter (P++) 104 and selective base 102 are formed through angled ion implantation processes. The cell is then completed using standard passivation and metallization techniques to form emitter metal 98 (which may be cobalt, copper, or nickel) and passivation dielectric layer 100. Anti-reflection coating 96 is an optical coating applied to the surface of the TFSC to reduce reflection.

Selective emitter 104 is conveniently obtained during the blanket implantation of emitter layer 94. The n-type wafer with a pyramidal 3-D structure is implanted with boron to form emitter layer 94—lower doped on the side walls but highly doped on the flat surface. Front side field 92 is obtained by blanket implantation of phosphorous. FIGS. 14A-15D depict a detailed process flow describing the formation of the three-dimensional thin-film solar cell shown in FIG. 9.

Figure 10:
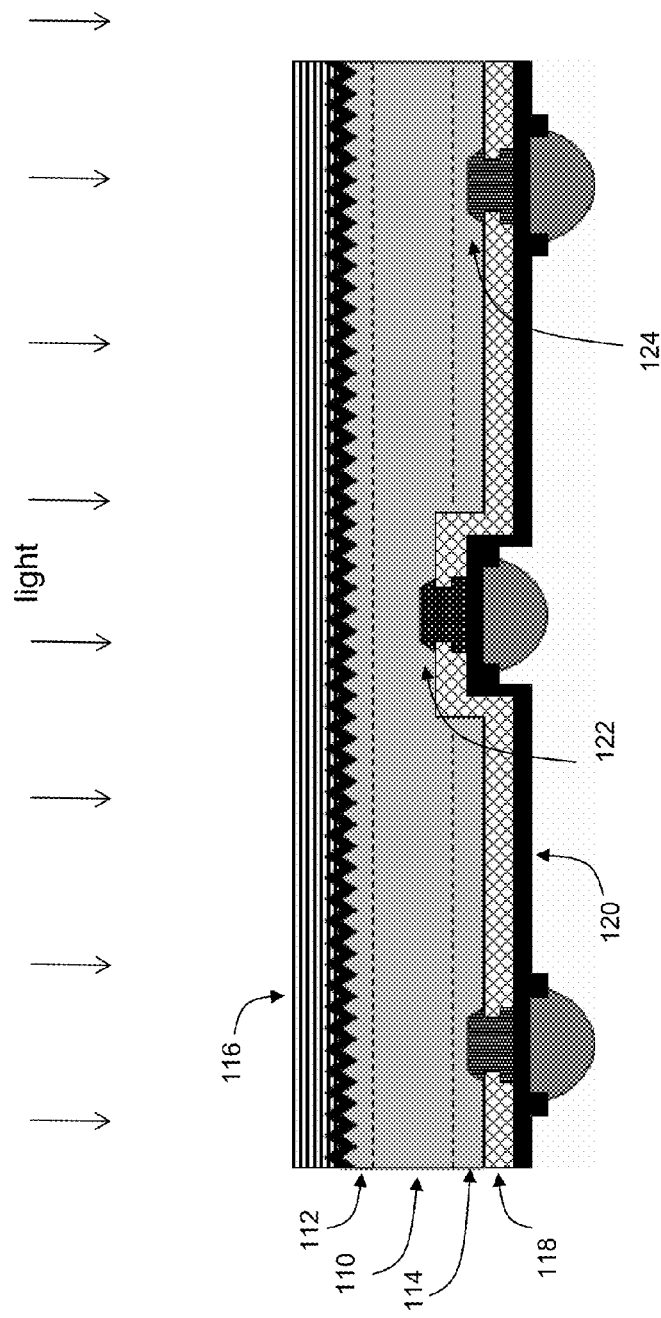
FIG. 10 illustrates a planar thin-film solar cell with all backside contacts.

FIG. 10 illustrates a planar thin-film solar cell with all backside contacts. N-type base 110, an epitaxial silicon layer, has been doped according to an ion implantation process to create N-type (N+) front side field 112 and p-type (P+) emitter layer 114. Selective emitter 124 and base 122 are formed through angled ion implantation processes and use plated metals, such as nickel and copper, as contacts. The cell is then completed using standard passivation and metallization techniques to form base and emitter contact metals and backside passivation dielectric layer 118. Anti-reflection coating 116 and reflective insulator 120 help to increase the light trapping capabilities of the planar TFSC.

The planar back contact TFSC in FIG. 10 may be made from planar thin-film c-Si wafers. N-type material is advantageous to when forming planar backside TFSC with methods of the present disclosure. P-type (P+) emitter layer 114 is first made using a blanket implantation of the back surface of the wafer with boron. Next, backside passivation dielectric layer 118 is grown or deposited. Base 122 is made by opening contacts in this dielectric and then implanting with phosphorous. Selective emitter 124 is made next by passivating with a dielectric layer and opening contacts and implanting with boron. Front surface field 112 is then obtained using the blanket implantation of phosphorous. FIGS. 16A-16H depict a detailed process flow describing the formation of the planar thin-film solar cell shown in FIG. 10.

FIG. 11A is a process flow showing the formation of a 3-dimensional pyramidal substrate utilizing a reusable template for forming a crystalline thin-film silicon solar cell (such as that shown in FIGS. 8 and 9). FIG. 11B is a corresponding illustrative depiction of the process steps in FIG. 11A. FIG. 11A is an embodiment of a process flow depicting major fabrication process steps for manufacturing an inverted pyramidal silicon template and three-dimensional thin-film silicon substrate for use in forming a thin-film silicon solar cell in accordance with the ion implantation methods of the present disclosure. In this embodiment, a template for manufacturing inverted pyramidal solar cells is formed.

The silicon template making process starts with a monocrystalline (100) silicon wafer (140). The starting wafer may be in circular or square shapes. Step 160 involves forming a thin hard masking layer (144) on the exposed wafer surfaces. The hard masking layer is used to mask the silicon surface areas that do not need to be etched in the later steps—the surface areas that will become the top surface of the template. The proper hard masking layer includes, but is not limited to, thermally grown silicon oxide and low-pressure vapor phase deposited (LPCVD) silicon nitride. Steps 162 involves a photolithography step, which consists of photoresist coating, baking, UV light exposure over a photomask, post baking, photoresist developing, wafer cleaning and drying. After this step, the pattern on the photomask (146) depicting an array or a staggered pattern of inverted pyramidal base openings, will be transferred to the photoresist layer. The patterned photoresist layer is used as a soft masking layer for the hard masking layer etching of step 164. Step 164 involves further transferring the photoresist pattern to the hard masking layer layered underneath by chemical etching, such as etching a thin silicon oxide layer with buffered HF solution. Other wet etching methods and dry etching methods as known in semiconductor and MEMS wafer processing may also be used. After oxide etch the remaining soft masking layer, i.e. the photoresist layer (150), is removed and the wafer (148) is cleaned. Examples of photoresist removal process include wet methods, such as using acetone or piranha solution (a mixture of sulfuric acid and In step 166 the wafers are batch loaded in an anisotropic silicon wet etchant such as KOH solution. The typical etch temperature is in the range of 50° C. to 80° C. and etch rate is about 0.2 um/min to 1 um/min. TMAH (tetramethylammonium hydroxide) is an alternative anisotropic silicon etching chemical. The KOH or TMAH silicon etch rate depends upon the orientations to crystalline silicon planes. The (111) family of crystallographic planes are etched at a very slow rate and are normally "stop" planes for the anisotropic etching of a (100) silicon wafer with patterned hard mask. As a result, the intersection of two (111) planes or a (111) plane with a bottom (100) plane produce anisotropic etching structures for (100) silicon wafers after a time-controlled etch. Examples of these structures include V-grooves and pyramidal cavities with sharp tip cavity bottom (where (111) planes meet) or a small flat cavity bottom (a remaining (100) plane). In step 168 the oxide from the top is removed and the template cleaned. Next, the wafer may be cleaned in standard SC1 (mixture of $NH_4OH$ and $H_2O_2$) and SC2 (mixture of HCL and $H_2O_2$) wafer wet cleaning solutions followed by a thorough deionized wafer rinsing and hot $N_2$ drying. The disclosed process results in a silicon template with inverted pyramidal cavities In step 170, silicon template 154 is ready for processing.

Figures 12A, 12B:
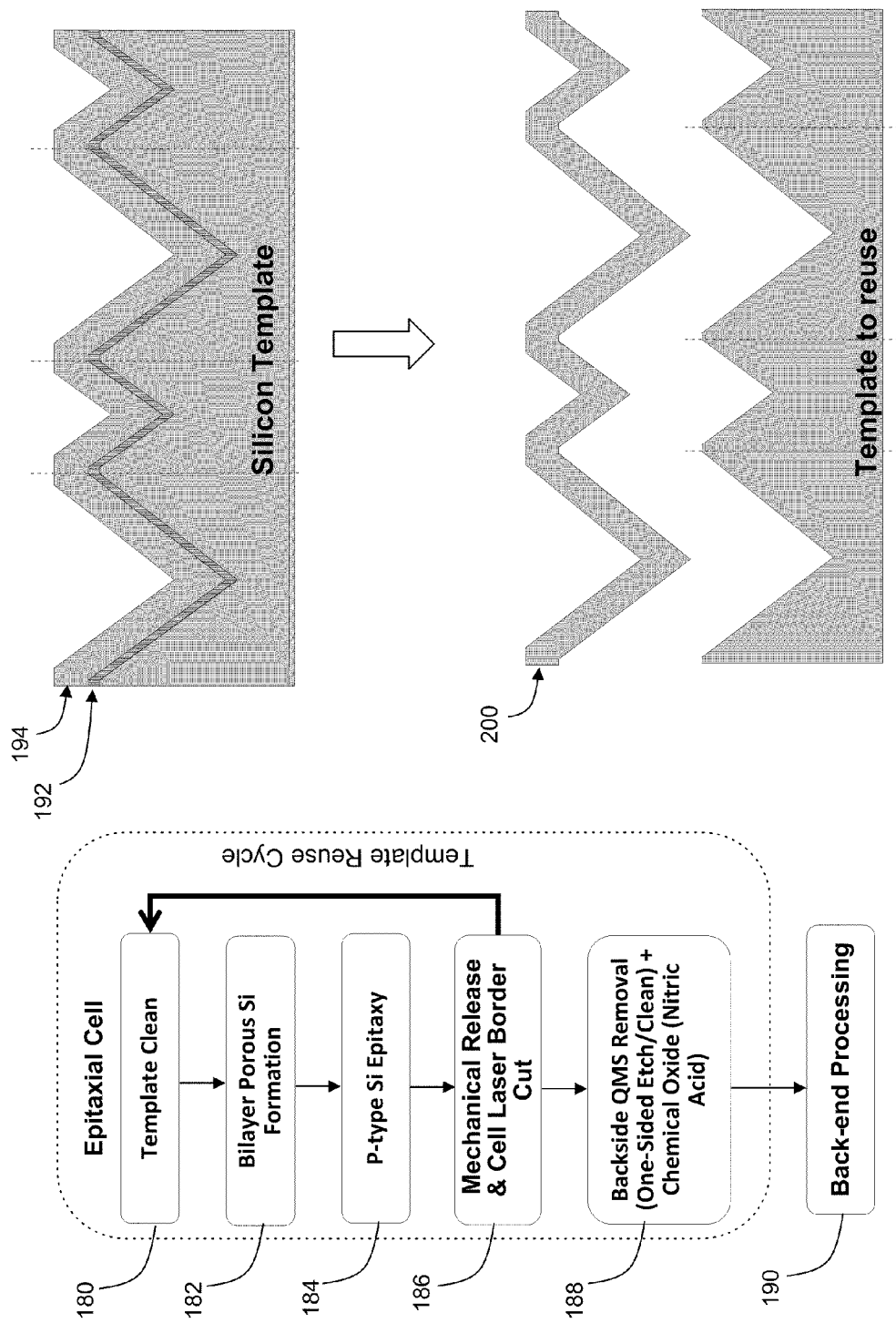

FIG. 12A is a process flow showing the formation of a epitaxial silicon substrate used for forming a crystalline thin-film front contact silicon solar cell (such as that shown in FIG. 8). FIG. 12B is a corresponding illustrative depiction of the process steps in FIG. 12A.

Step 180 marks the beginning of a silicon template re-use cycle. In step 182, a porous silicon layer (192) is formed by electrochemical HF etching on the silicon template front surfaces. The porous silicon layer is to be used as a sacrificial layer for epitaxial silicon layer release. The porous silicon layer preferably consists of two thin layers with different porosities. The first thin porous silicon layer is a top layer and is formed first from the bulk silicon wafer. The first thin layer preferably has a lower porosity of 10%-35%. The second thin porous silicon layer is directly grown from the bulk silicon and is underneath the first thin layer of porous silicon. The $2^{nd}$ thin porous silicon layer preferably has a higher porosity in the range of 40%~80%. The top porous silicon layer is used as a crystalline seed layer for high quality epitaxial silicon growth and the bottom underneath higher porosity porous silicon layer is used for facilitating TFSS release due to its less dense physical connections between the epitaxial and bulk silicon interfaces and its weak mechanical strength. Alternatively, a single porous silicon layer with a progressively increased or graded porosity from top to bottom may also be used. In this case, the top portion of the porous silicon layer has a low porosity of 10% to 35% and the lower portion of the porous silicon layer has a high porosity of 40% to 80%. Before step 184, the epitaxial silicon growth, the wafer may be baked in a high temperature (at 950° C. to 1150° C.) hydrogen environment within the epitaxial silicon deposition reactor in order to form coalesced structures with relatively large voids within the higher-porosity porous silicon layer (or portion of a single layer) while forming a continuous surface seed layer of crystalline silicon on the lower-porosity porous silicon layer (or portion of a single layer). In step 184, a mono-crystalline silicon epitaxial layer with n-type base (194) is deposited on the front side only. For front contacted cell, the bulk base of the epitaxial layer is p-type, boron ($B_2H_6$) doped. The thickness of the epitaxial layer is preferably in the range of 10 um to 60 um. Prior to the release of the epitaxial silicon layer, an encompassing border trench may be made on the peripheral of the active wafer area to facilitate the release of the TFSS. The encompassing trenches may be formed by controlled laser cutting and their depths are preferably in the range of 10 um to 100 um. The trenches define the boundary of the 3-D TFSS to be released and allow initiation of the release from the trenched region. The remaining epitaxial silicon layer may be removed by mechanical grinding or polishing of the template edges. In step 186, the epitaxial layer of silicon (200) is released and separated from the silicon template. The released epitaxial silicon layer is referred to as a 3-D thin film silicon substrate (3-D TFSS). The epitaxial layer release methods disclosed in U.S. patent application Ser. No. 12/473,811 entitled, SUBSTRATE RELEASE METHODS AND APPARATUS are hereby incorporated by reference. The 3-D TFSS may be released in an ultrasonic DI-water bath. Or in another release method, the 3-D TFSS may be released by direct pulling with wafer backside and top epitaxial vacuum chucked. In another release method, the epitaxial layer is released by direct pulling with wafer backside and top epitaxial vacuum chucked. Using this method the porous silicon layer may be fully or partially fractured. The chucks may use either electrostatic or vacuum chucking to secure the wafer. The wafer is first placed on bottom wafer chuck with TFSS substrate facing upwards. A bottom chuck secures the template side of wafer, and the top wafer chuck is gently lowered and secures TFSS substrate side of the wafer. The activated pulling mechanism lifts top chuck upwards, and the movement may be guided evenly by slider rails.

In step 188, the released 3-D TFSS backside surface is cleaned by short silicon etching using KOH or TMAH solutions to remove the silicon debris and fully or partially remove the quasi-mono-crystalline silicon (QMS) layer. After removal of the epitaxial silicon layer from the template, the template is cleaned in step 175 by using diluted HF and diluted wet silicon etch solution, such as TMAH and/or KOH to remove the remaining porous silicon layers and silicon particles. Then the template is further cleaned by conventional silicon wafer cleaning methods, such as SC1 and SC2 wet cleaning to removal possible organic and metallic contaminations. Finally, after proper rinsing with DI water and $N_2$ drying, the template is ready for another re-use cycle.

FIG. 13A is a process flow showing the formation of a front contact crystalline thin-film silicon solar cell (such as that shown in FIG. 8). FIG. 13B is a corresponding illustrative depiction of the process steps in FIG. 13A.

Figures 13C, 13D:
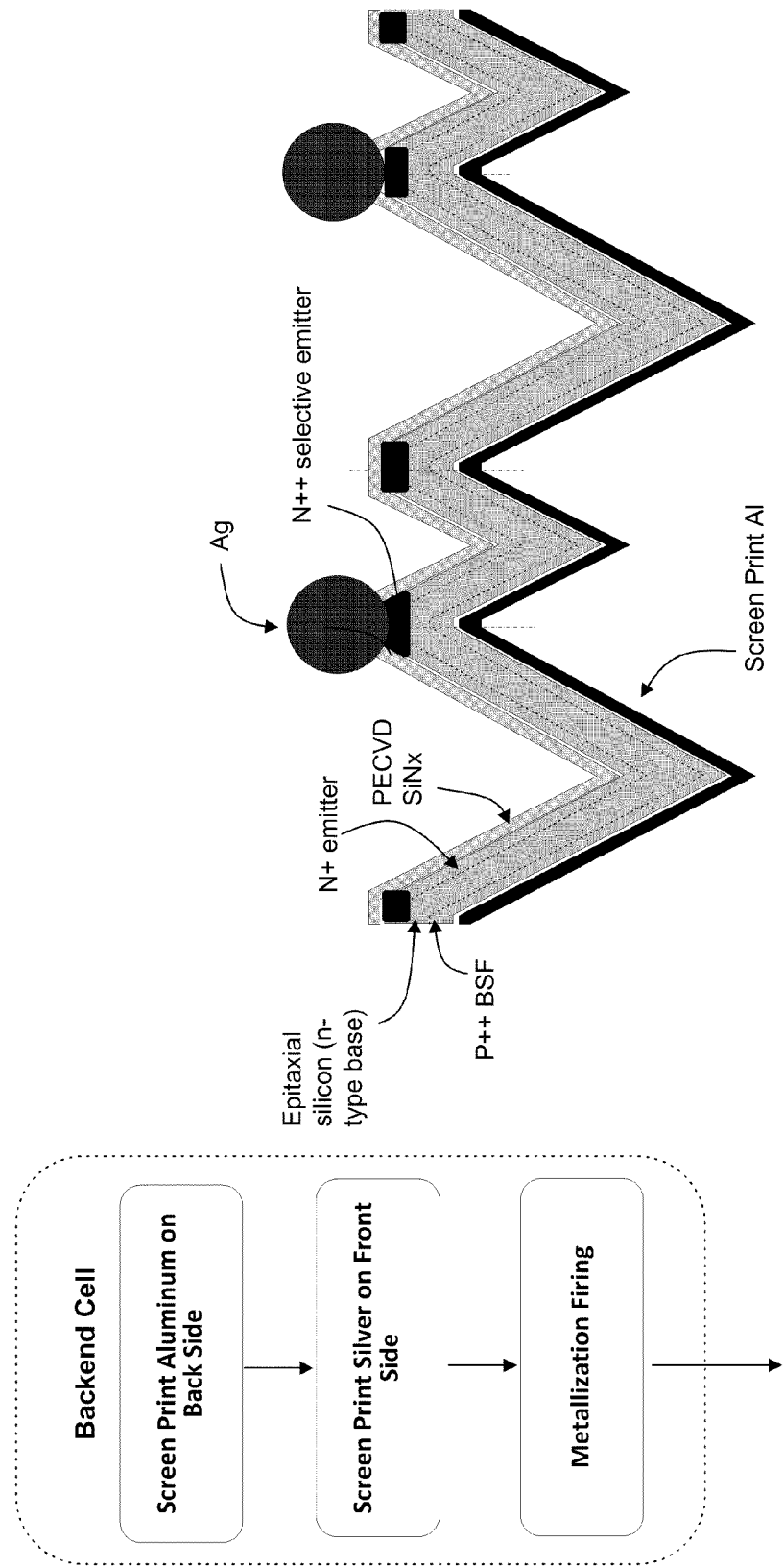

FIG. 13C is a continuation of the process flow in FIG. 13A showing the formation of a front contact crystalline thin-film silicon solar cell (such as that shown in FIG. 8). FIG. 13D is a corresponding illustrative depiction of the process steps in FIG. 13C.

Figure 14B:
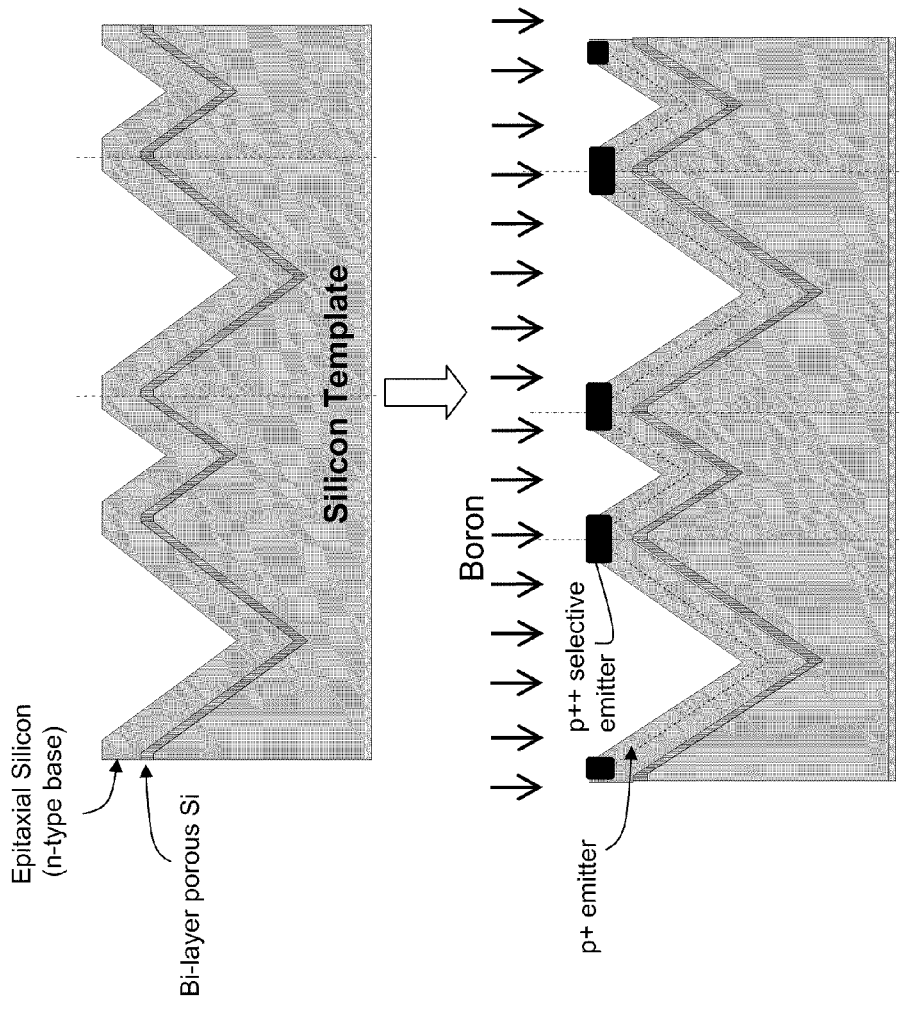
FIGS. 14A through 15D show the process flow for the formation of a back contact crystalline thin-film silicon solar cell in accordance with the disclosed subject matter.
Figure 14A:
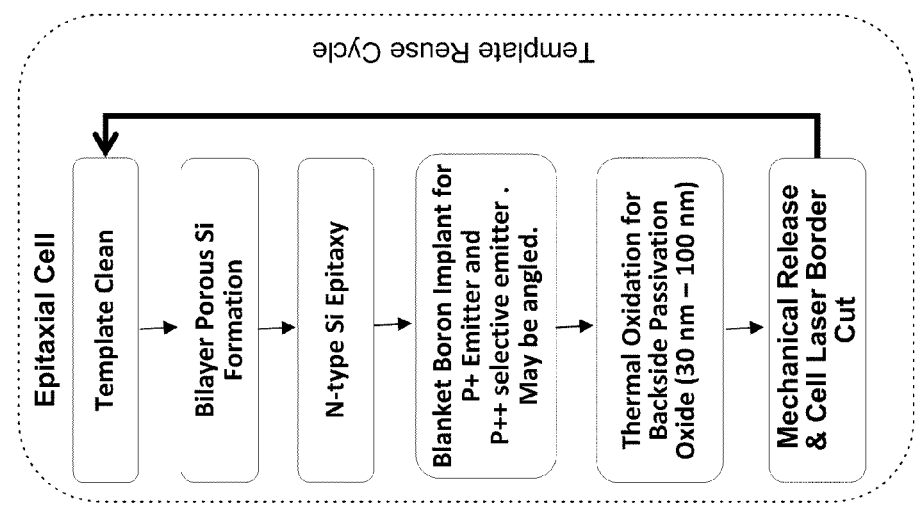

FIG. 14A is a process flow showing the formation of a epitaxial silicon substrate used for forming a back contact crystalline thin-film silicon solar cell (such as that shown in FIG. 9). FIG. 14B is a corresponding illustrative depiction of the process steps in FIG. 14A.

Figure 14D:
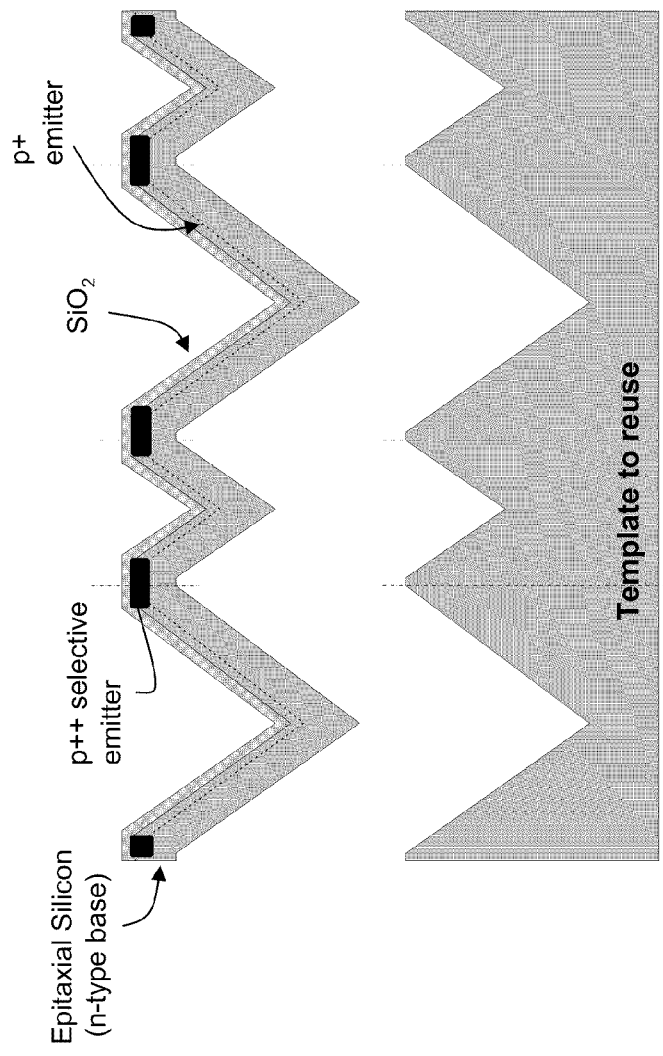
Figure 14C:
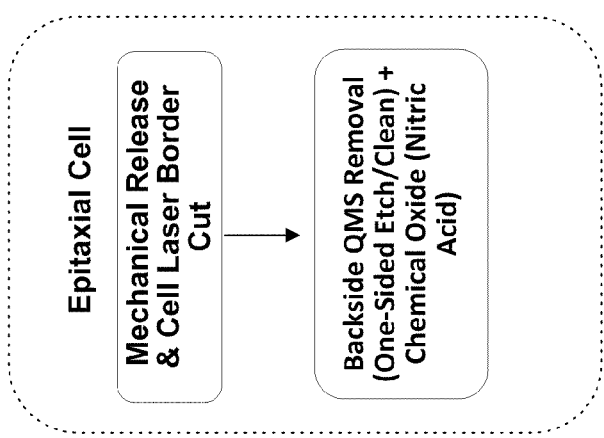

FIG. 14C is a continuation of the process flow in FIG. 14A showing the formation of a epitaxial silicon substrate used for forming a back contact crystalline thin-film silicon solar cell (such as that shown in FIG. 9). FIG. 14D is a corresponding illustrative depiction of the process steps in FIG. 14C.

Figure 15B:
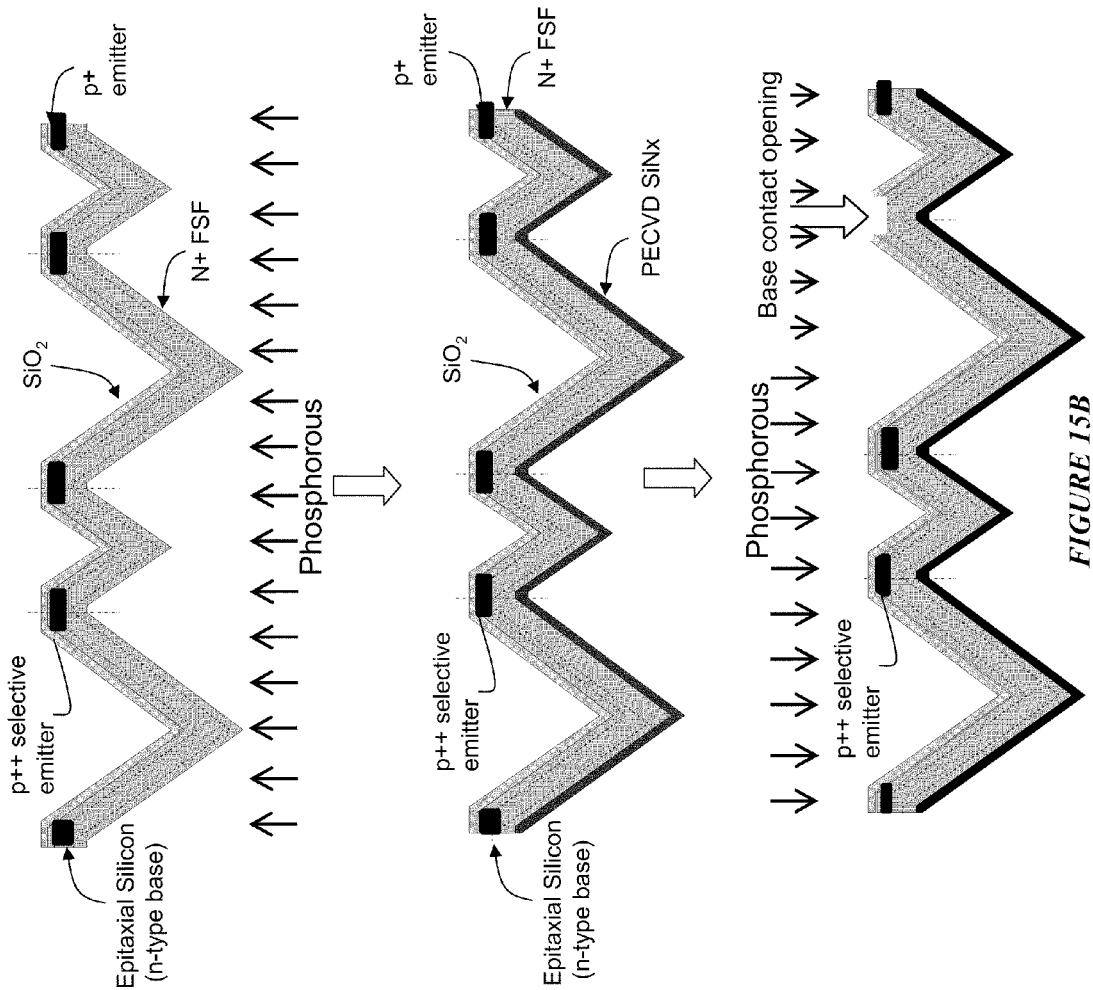
Figure 15A:
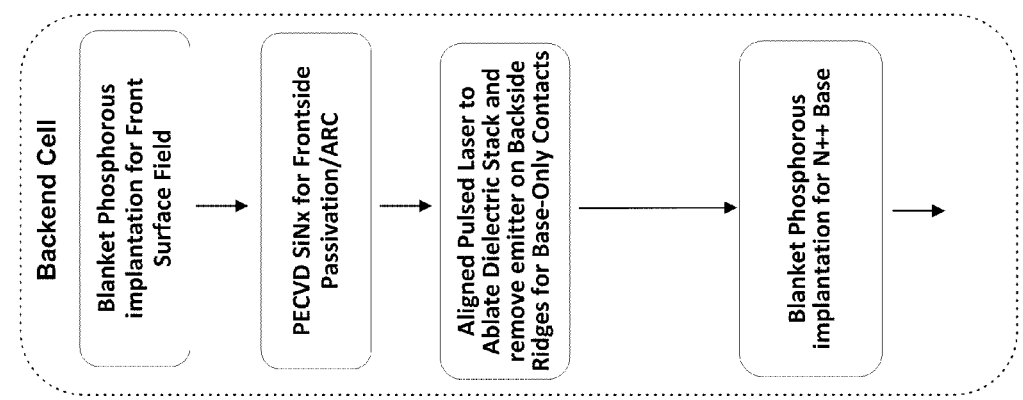

FIG. 15A is a process flow showing the formation of a back contact crystalline thin-film silicon solar cell (such as that shown in FIG. 9). FIG. 15B is a corresponding illustrative depiction of the process steps in FIG. 15A.

Figure 15D:
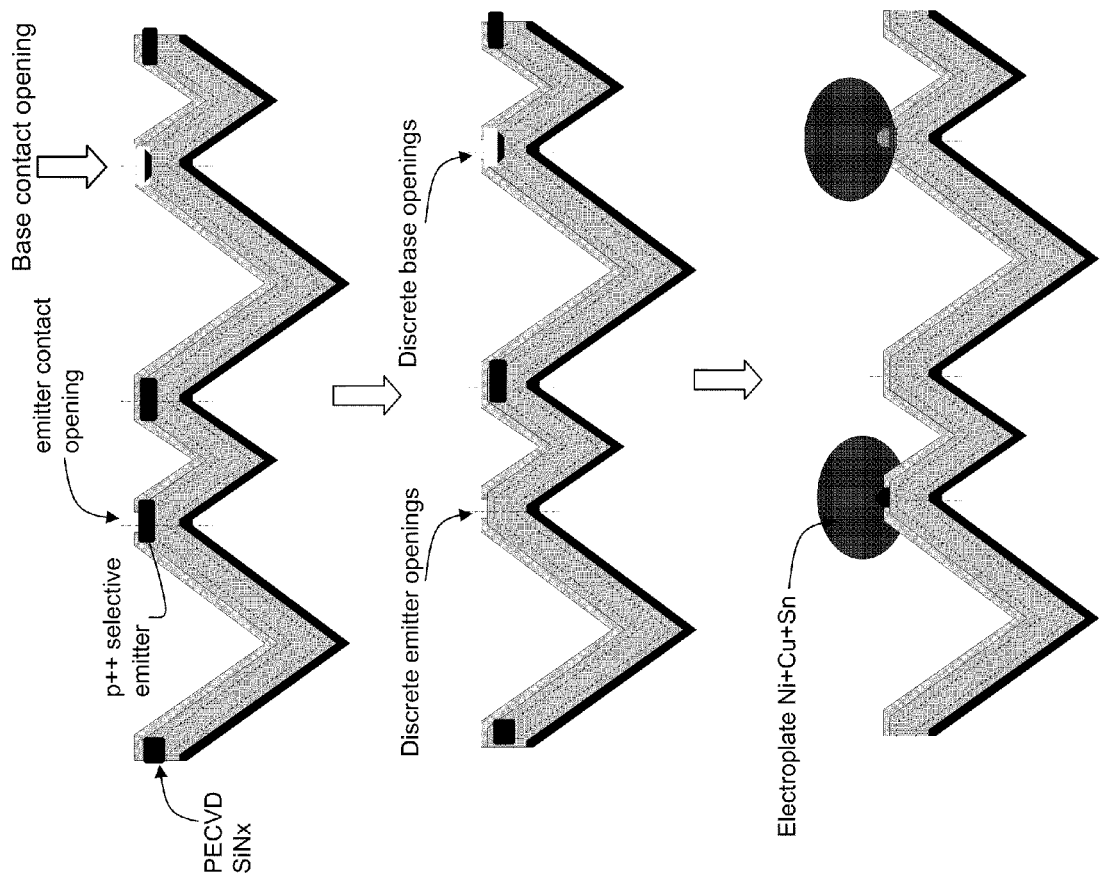
Figure 15C:
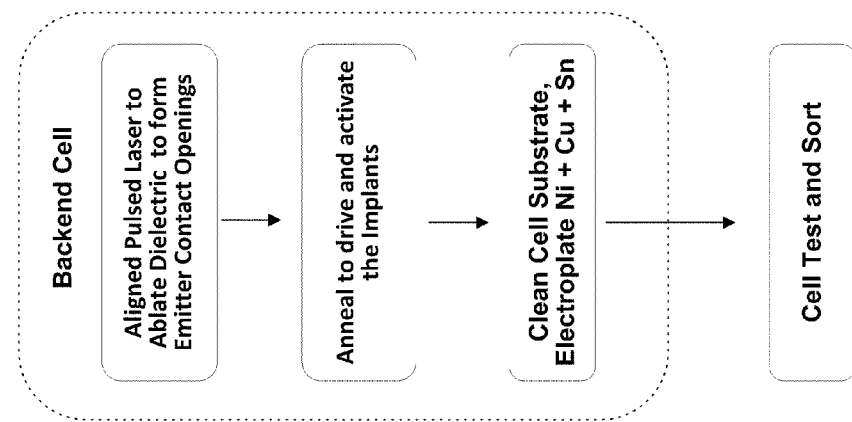

FIG. 15C is a continuation of the process flow in FIG. 15A showing the formation of a back contact crystalline thin-film silicon solar cell (such as that shown in FIG. 9). FIG. 15D is a corresponding illustrative depiction of the process steps in FIG. 15C.

FIG. 16A is a process flow showing the formation of a planar back contact crystalline thin-film silicon solar cell (such as that shown in FIG. 10). FIG. 16B is a corresponding illustrative depiction of the process steps in FIG. 16A.

Figures 16C, 16D:
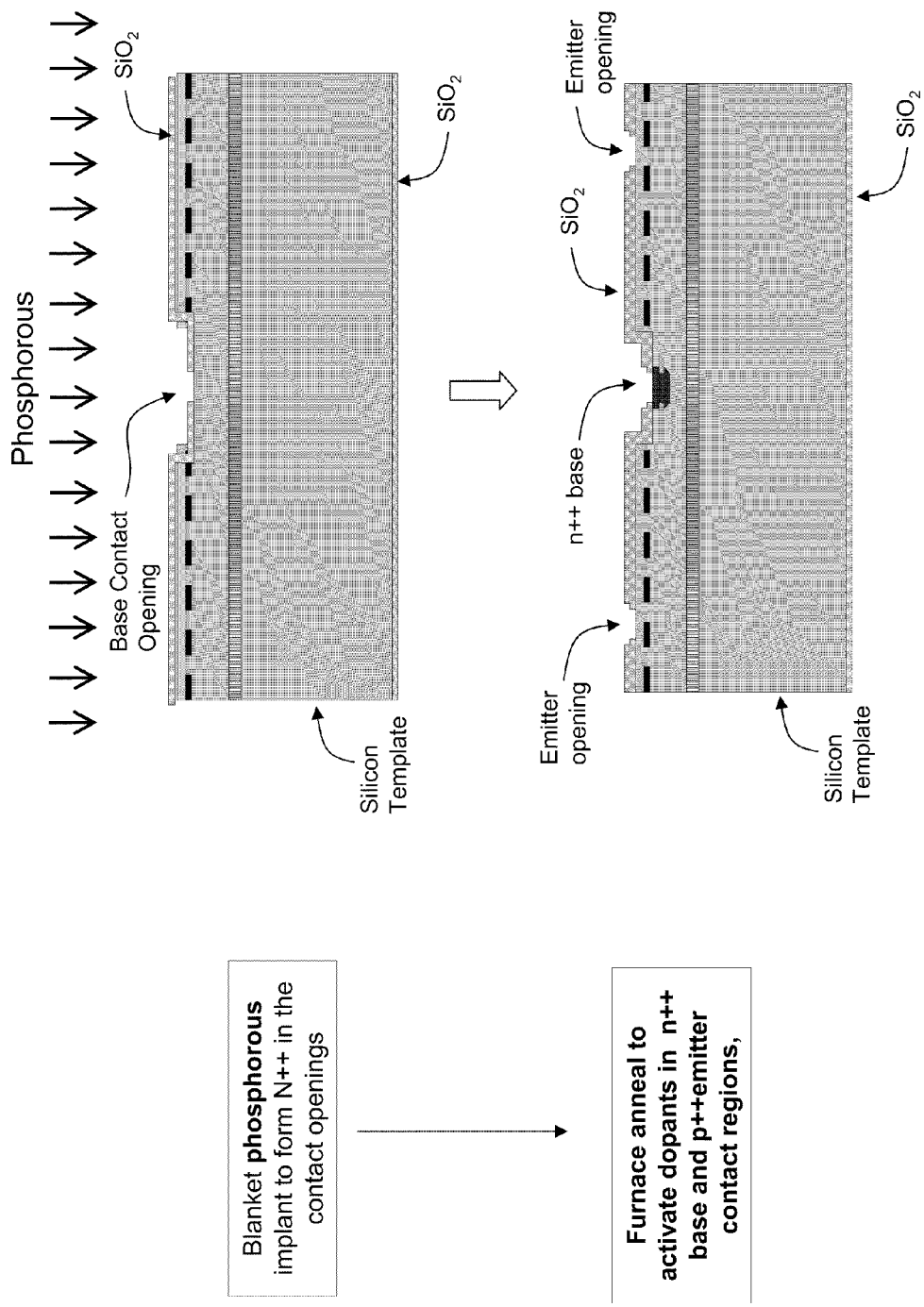

FIG. 16C is a continuation of the process flow in FIG. 16A showing the formation of a planar back contact crystalline thin-film silicon solar cell (such as that shown in FIG. 10). FIG. 16D is a corresponding illustrative depiction of the process steps in FIG. 16C.

Figures 16E, 16F:
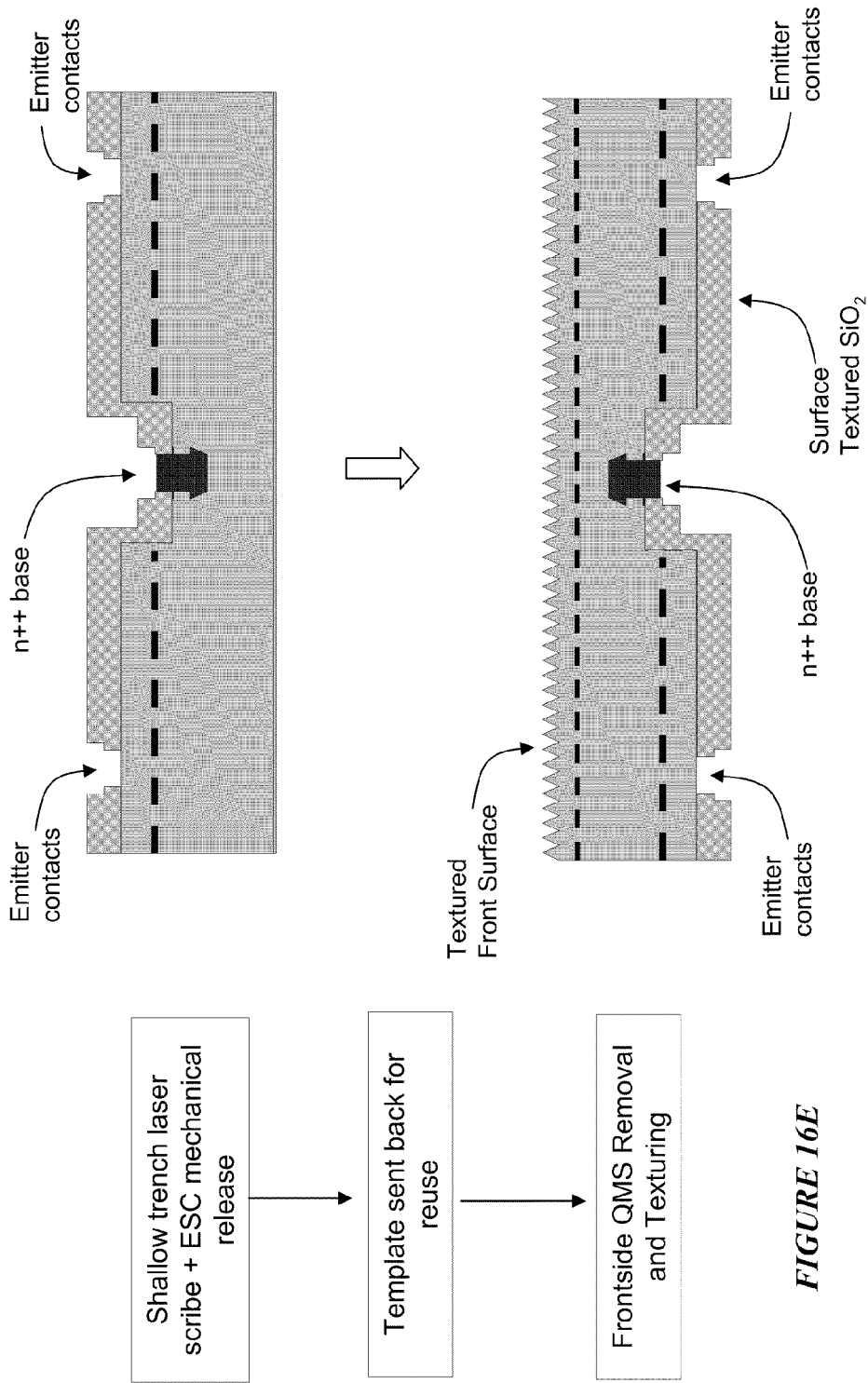

FIG. 16E is a continuation of the process flow in FIG. 16A showing the formation of a planar back contact crystalline thin-film silicon solar cell (such as that shown in FIG. 10). FIG. 16F is a corresponding illustrative depiction of the process steps in FIG. 16E.

Figures 16G, 16H:
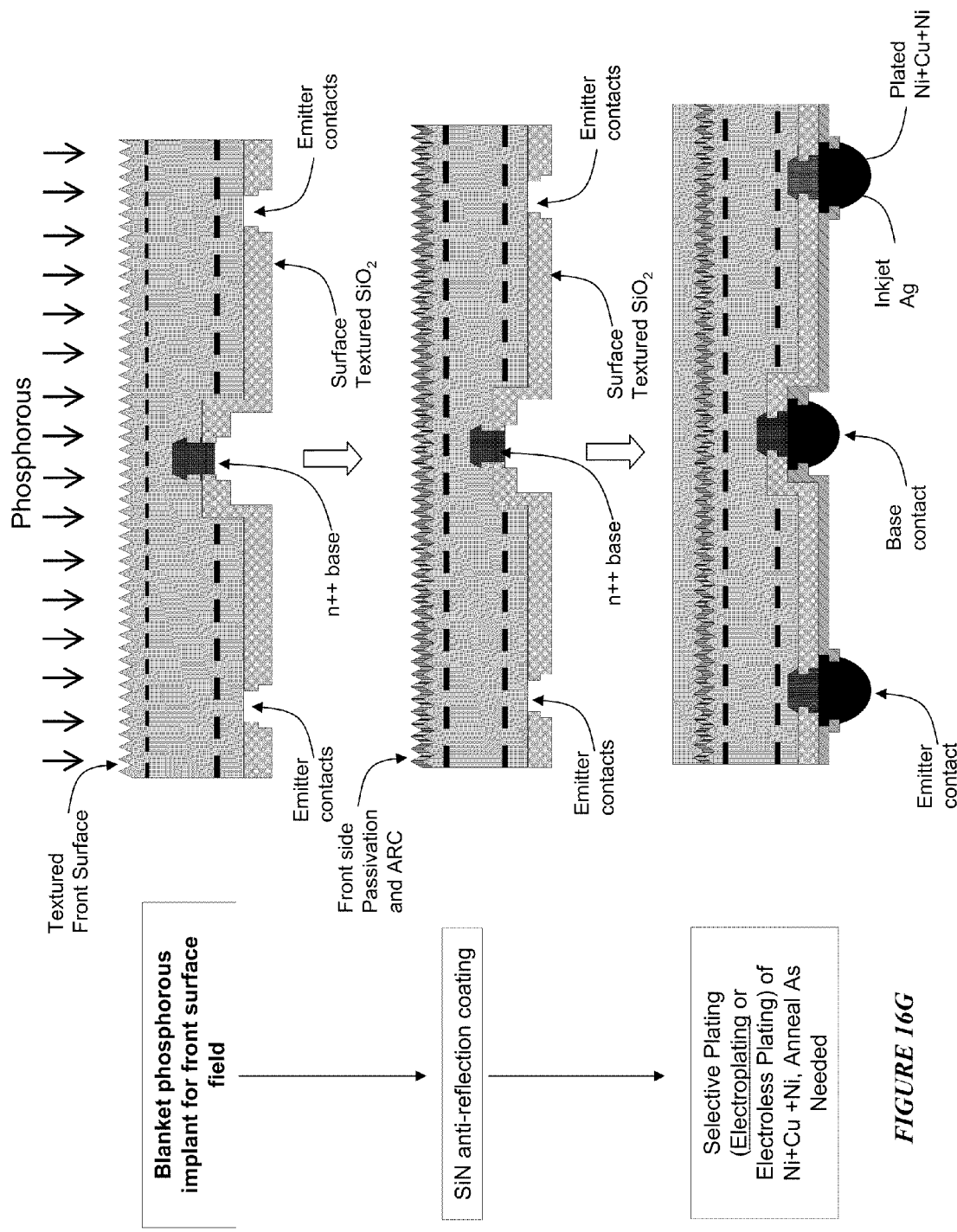

FIG. 16G is a continuation of the process flow in FIG. 16A showing the formation of a planar back contact crystalline thin-film silicon solar cell (such as that shown in FIG. 10). FIG. 16H is a corresponding illustrative depiction of the process steps in FIG. 16G.

In operation, the disclosed subject matter provides ion implantation methods for forming emitter regions, selective emitter regions, front surface fields, back surface fields, and base regions for the formation of crystalline thin-film silicon solar cells.

The foregoing description of the exemplary embodiments is provided to enable any person skilled in the art to make or use the subject matter. Various modifications to these embodiments will be readily apparent to those skilled in the art, and the generic principles defined herein may be applied to other embodiments without the use of the innovative faculty. Thus, the subject matter to be claimed in subsequently filed applications is not intended to be limited to the embodiments shown herein but is to be accorded the widest scope consistent with the principles and novel features disclosed herein.

What is claimed is:

1. A method for the fabrication of an all back contact thin-film crystalline silicon solar cell from a thin-film silicon substrate, the method comprising:
    forming a thin-film crystalline silicon substrate by the steps of:
        forming a porous sacrificial layer on and conformal to the surface of a silicon template;
        subsequently depositing an epitaxial silicon layer on said sacrificial layer;
        selectively cutting said sacrificial layer in a predetermined size and pattern; and
    releasing said epitaxial silicon layer from said silicon template;
    implanting ions of an element in said thin-film silicon substrate to form emitter regions;
    implanting ions of an element in said thin-film silicon substrate to form selective emitter regions;
    implanting ions of an element in said thin-film silicon substrate to form a front surface field;
    implanting ions of an element in said thin-film silicon substrate to form base regions; and
    forming selective metallization contacts on said selective emitter regions and said base regions.

2. The method of claim 1, wherein said thin-film crystalline silicon substrate is a three-dimensional thin-film crystalline silicon substrate.

3. The method of claim 2, wherein said three-dimensional thin-film crystalline silicon substrate comprises a plurality of inverted pyramidal surface features comprising a top surface aligned along a (100) crystallographic orientation plane of said three-dimensional thin-film silicon substrate and a plurality of walls each aligned along a (111) crystallographic orientation plane of said three-dimensional thin-film crystalline silicon substrate.

4. The method of claim 2, wherein said three-dimensional thin-film crystalline silicon substrate comprises a plurality of prism surface features.

5. The method of claim 1, wherein said thin-film crystalline silicon substrate is substantially planar.

6. The method of claim 2, wherein said step of implanting ions of an element in said thin-film crystalline silicon substrate to form selective emitter regions further comprises implanting ions of an element in said thin-film silicon substrate to form selective emitter regions according to an angled ion implantation process.

7. The method of claim 1, wherein said step of implanting ions of an element in said thin-film crystalline silicon substrate to form emitter regions further comprises implanting ions of an element in said thin-film crystalline silicon substrate to form emitter regions with controlled dopant profiles.

8. The method of claim 1, wherein said step of implanting ions of an element in said thin-film silicon substrate to form emitter regions further comprises implanting ions of an element in said thin-film silicon substrate to form homogeneous emitter regions.

9. The method of claim 1, wherein said step of implanting ions of an element in said thin-film crystalline silicon substrate to form a front surface field further comprises implanting ions of an element in said thin-film crystalline silicon substrate to form a homogeneous front surface field.

10. The method of claim 1, further comprising the step of forming localized openings in a dielectric layer, comprising the steps of:
    selectively implanting ions of an element which slows the growth of oxide during oxidation;
    oxidizing to form a passivating oxide layer with selective openings; and
    forming selective metallization contacts on said selective openings.

11. The method of claim 1, further comprising the step of enhancing the field effect of said emitter regions and said back surface field.

12. A method for the fabrication of an all back contact thin-film crystalline silicon solar cell from a thin-film silicon substrate, the method comprising:
    implanting ions of an element in said thin-film silicon substrate to form emitter regions;
    implanting ions of an element in said thin-film silicon substrate to form selective emitter regions;
    implanting ions of an element in said thin-film silicon substrate to form a front surface field;
    implanting ions of an element in said thin-film silicon substrate to form base regions; and
    forming selective metallization contacts on said selective emitter regions and said base regions, comprising the steps of:
        forming localized openings in a dielectric layer, comprising the steps of:
        selectively implanting ions of an element which slows the growth of oxide during oxidation;
        oxidizing to form a passivating oxide layer with selective openings; and
        forming selective metallization contacts on said selective openings.

13. The method of claim 12, further comprising the step of:
    forming a thin-film crystalline silicon substrate by the steps of:
        forming a porous sacrificial layer on and conformal to the surface of a silicon template;
        subsequently depositing an epitaxial silicon layer on said sacrificial layer;
        selectively cutting said sacrificial layer in a predetermined size and pattern; and
        releasing said epitaxial silicon layer from said silicon template.

14. The method of claim 12, wherein said thin-film crystalline silicon substrate is a three-dimensional thin-film crystalline silicon substrate.

15. The method of claim 14, wherein said three-dimensional thin-film crystalline silicon substrate comprises a plurality of inverted pyramidal surface features comprising a top surface aligned along a (100) crystallographic orientation plane of said three-dimensional thin-film silicon substrate and a plurality of walls each aligned along a (111) crystallographic orientation plane of said three-dimensional thin-film crystalline silicon substrate.

16. The method of claim 14, wherein said three-dimensional thin-film crystalline silicon substrate comprises a plurality of prism surface features.

17. The method of claim 12, wherein said thin-film crystalline silicon substrate is substantially planar.

18. The method of claim 14, wherein said step of implanting ions of an element in said thin-film crystalline silicon substrate to form selective emitter regions further comprises implanting ions of an element in said thin-film silicon substrate to form selective emitter regions according to an angled ion implantation process.

19. The method of claim 12, wherein said step of implanting ions of an element in said thin-film crystalline silicon substrate to form emitter regions further comprises implanting ions of an element in said thin-film crystalline silicon substrate to form emitter regions with controlled dopant profiles.

20. The method of claim 12, wherein said step of implanting ions of an element in said thin-film silicon substrate to form emitter regions further comprises implanting ions of an element in said thin-film silicon substrate to form homogeneous emitter regions.

21. The method of claim 12, wherein said step of implanting ions of an element in said thin-film crystalline silicon substrate to form a front surface field further comprises implanting ions of an element in said thin-film crystalline silicon substrate to form a homogeneous front surface field.

22. The method of claim 12, further comprising the step of enhancing the field effect of said emitter regions and said back surface field.

* * * * *